(12) United States Patent
Takeuchi et al.

(10) Patent No.: US 7,808,333 B2
(45) Date of Patent: Oct. 5, 2010

(54) IC FOR CONTROL OF TEMPERATURE-COMPENSATED CRYSTAL OSCILLATOR

(75) Inventors: Hisato Takeuchi, Kanagawa (JP); Keigo Shingu, Tokyo (JP); Kei Nagatomo, Kanagawa (JP)

(73) Assignee: Panasonic Corporation, Osaka (JP)

( * ) Notice: Subject to any disclaimer, the term of this patent is extended or adjusted under 35 U.S.C. 154(b) by 35 days.

(21) Appl. No.: 12/105,879

(22) Filed: Apr. 18, 2008

(65) Prior Publication Data

US 2008/0258830 A1 Oct. 23, 2008

(30) Foreign Application Priority Data

Apr. 20, 2007 (JP) ............ P. 2007-111928

(51) Int. Cl.
*H03B 5/32* (2006.01)
*H03L 1/02* (2006.01)
(52) U.S. Cl. ............................. 331/158; 331/176
(58) Field of Classification Search ............ 331/116 R, 331/154, 158, 176
See application file for complete search history.

(56) References Cited

U.S. PATENT DOCUMENTS

| | | | |
|---|---|---|---|
| 5,668,506 A * | 9/1997 | Watanabe et al. ............. 331/66 |
| 5,724,009 A | 3/1998 | Collins et al. | |
| 6,515,548 B2 * | 2/2003 | Matsumoto et al. ........... 331/25 |
| 7,221,233 B2 * | 5/2007 | Brennan et al. ............. 331/158 |

FOREIGN PATENT DOCUMENTS

JP 2003-188646 7/2003

* cited by examiner

*Primary Examiner*—Robert Pascal
*Assistant Examiner*—Levi Gannon
(74) *Attorney, Agent, or Firm*—McDermott Will & Emery LLP

(57) ABSTRACT

A temperature-compensated crystal oscillator includes a mode selector circuit 100, a control logic serial•interface 200, a PROM circuit 300, an oscillation control circuit 400 and an oscillation circuit 500, and has, as terminals, a power terminal (VCC/CLK) 11, an input terminal (VC/DATA/PE) 12, an output terminal (OUT) 13 and a ground terminal (GND) 14. The mode selector circuit 100 switches the crystal oscillator to an emulation mode when a first signal in which a power voltage and a clock signal supplied through the power terminal 11 are superimposed, is inputted from the power terminal and a second signal having a predetermined pattern is inputted from the input terminal 12.

7 Claims, 44 Drawing Sheets

THIRD-ORDER CONTROL
VOLTAGE OUTPUT

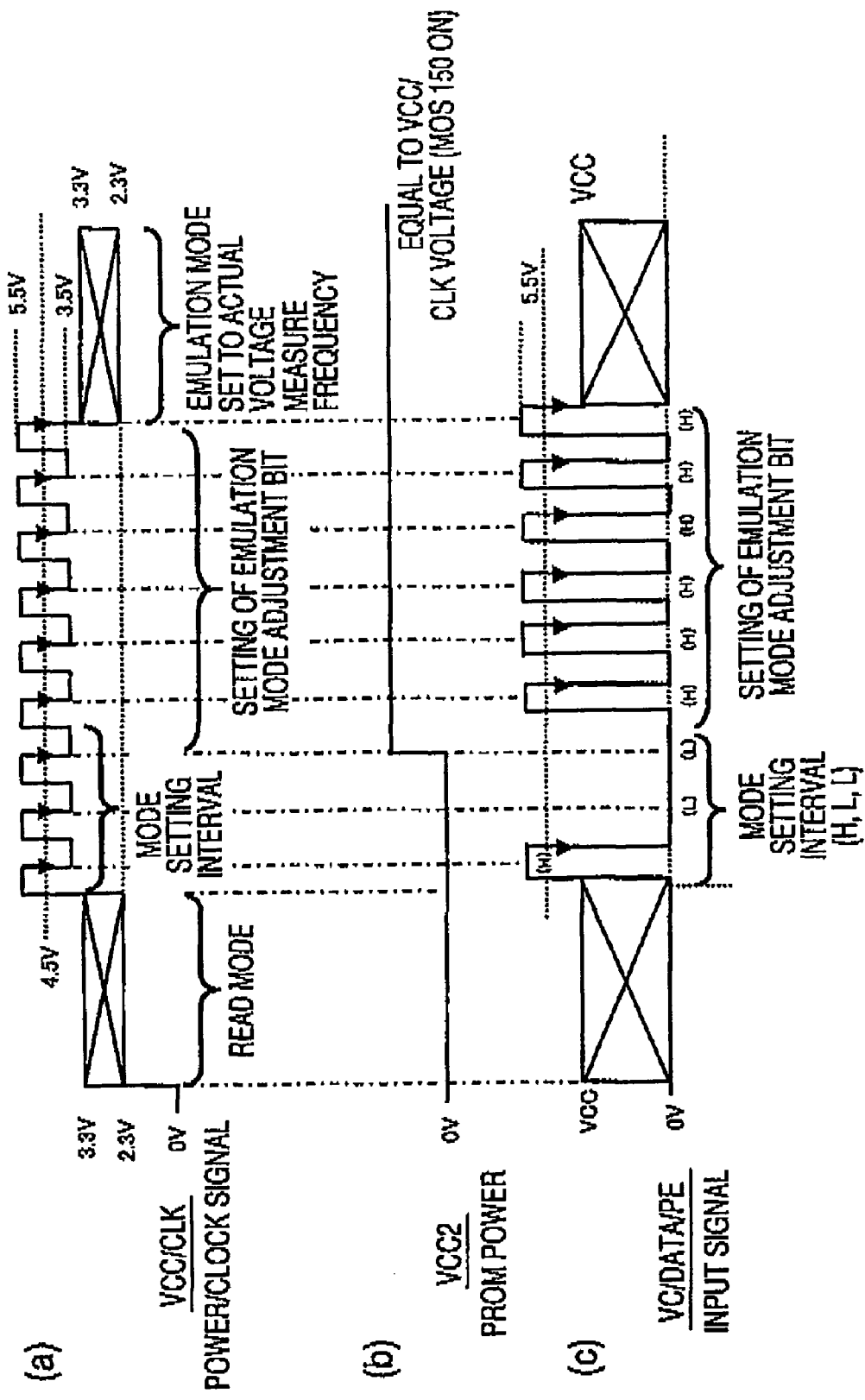

-- PRIOR ART --

-- PRIOR ART --

CONTROL LOGIC + SERIAL CONTROL CIRCUIT

FIG. 20
MODE (EMULATION MODE/READ MODE) SWITCHING SETTING METHOD
(a) INPUT WAVEFORM OF OUT/CLK TERMINAL
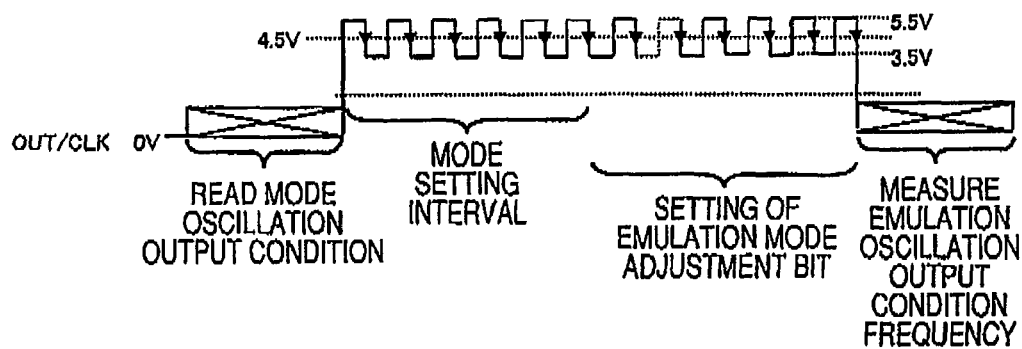
(b) VCC
(c) VCC2
(d) INPUT WAVEFORM OF VC/DATA/PE TERMINAL (IN CASE OF FIG. 15)
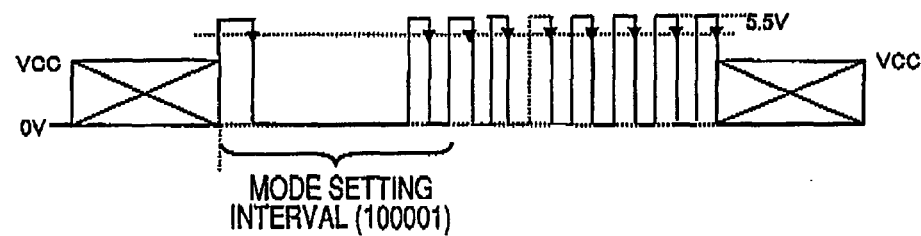
(e) INPUT WAVEFORM OF VC/DATA/PE TERMINAL (IN CASE OF FIG. 16)
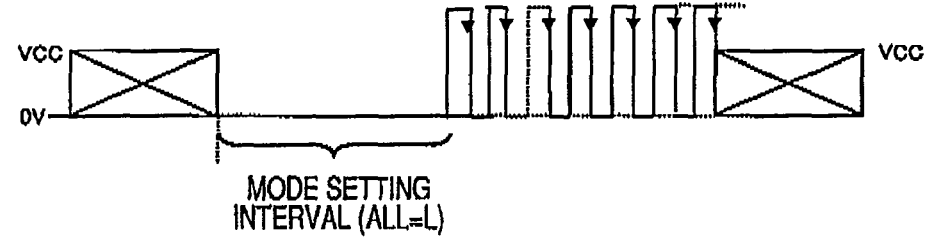

-- PRIOR ART --

-- PRIOR ART --

FIG. 30
MODE (EMULATION MODE/READ MODE) SWITCHING SETTING METHOD
(a) INPUT WAVEFORM OF VC/CLK/PE TERMINAL
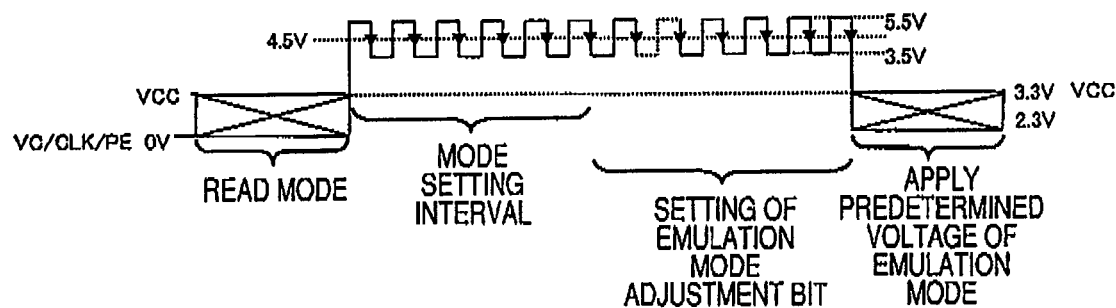
(d) INPUT WAVEFORM OF OUT/DATA TERMINAL (IN CASE OF FIG. 25)
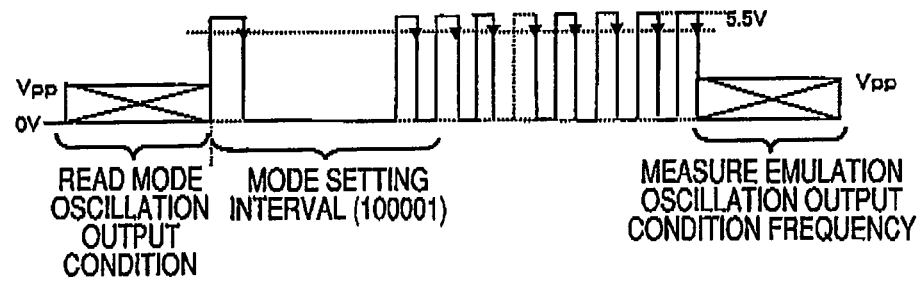
(e) INPUT WAVEFORM OF VC/DATA TERMINAL (IN CASE OF FIG. 26)
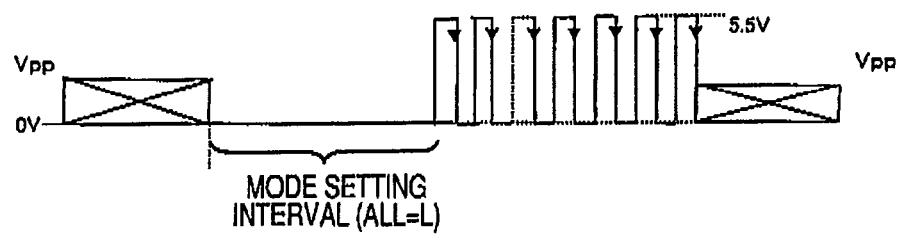

CONTROL LOGIC + SERIAL CONTROL CIRCUIT

FIG. 36
MODE (EMULATION MODE/READ MODE) SWITCHING SETTING METHOD
(a) INPUT WAVEFORM OF VC/CLK TERMINAL
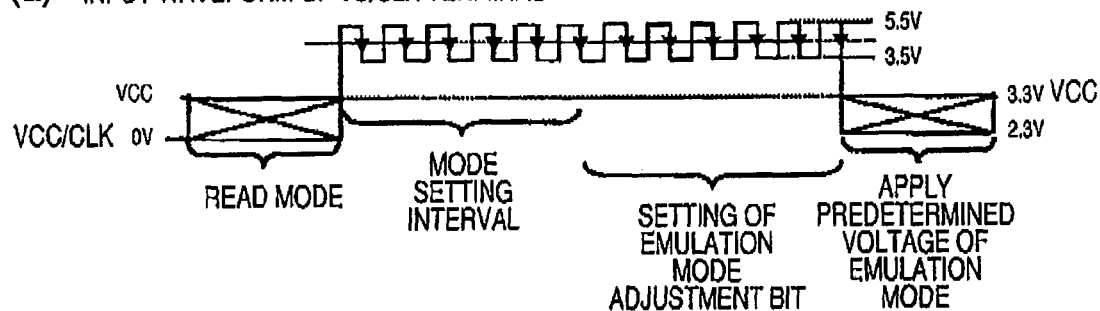
(b)
(c) INPUT WAVEFORM OF OUT/DATA TERMINAL (IN CASE OF FIG. 31)
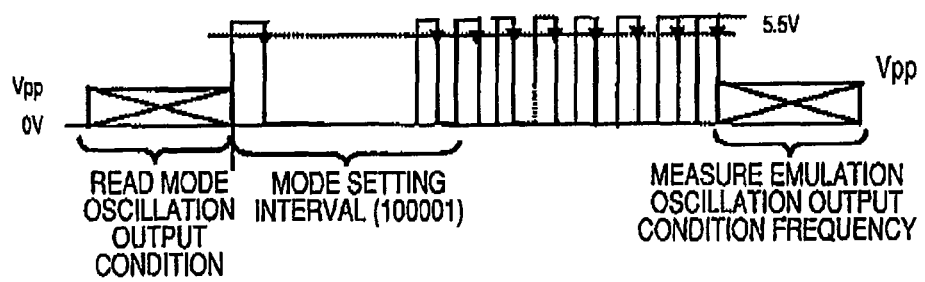
(d) INPUT WAVEFORM OF OUT/DATA TERMINAL (IN CASE OF FIG. 32)
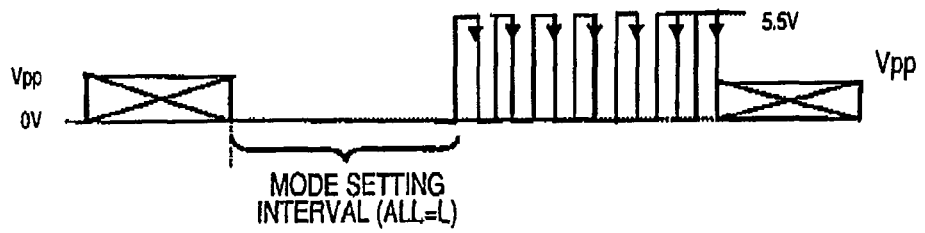

CONTROL LOGIC + SERIAL CONTROL CIRCUIT

FIG. 44
MODE (EMULATION MODE/READ MODE) SWITCHING SETTING METHOD
(a) INPUT WAVEFORM OF XT1 OR XT2/CLK TERMINAL
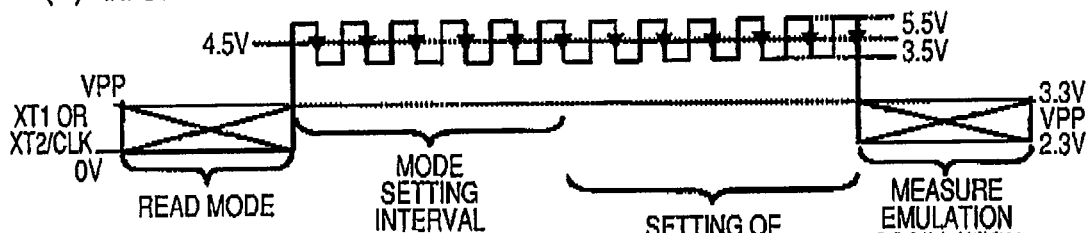
(b)
(c) INPUT WAVEFORM OF VC/DATA/PE TERMINAL (IN CASE OF FIG. 39)
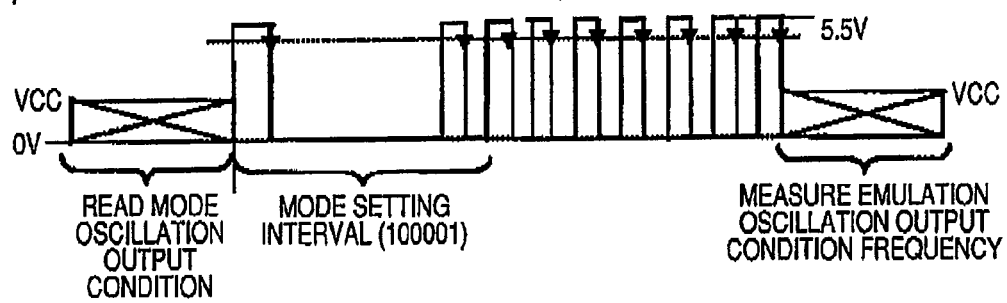
(d) INPUT WAVEFORM OF VC/DATA/PE TERMINAL (IN CASE OF FIG. 40)
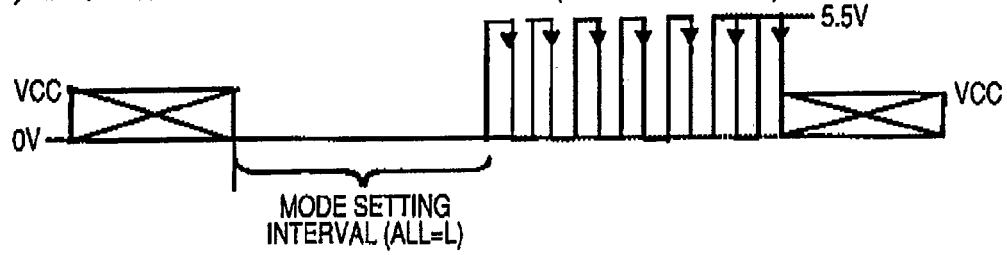

IC FOR CONTROL OF TEMPERATURE-COMPENSATED CRYSTAL OSCILLATOR

BACKGROUND OF THE INVENTION

1. Field of the Invention

The present invention relates to an IC for control of a temperature-compensated crystal oscillator (TCXO), and more particularly, to a crystal oscillator and common use of terminals of an IC for control thereof.

2. Description of the Related Art

Modern crystal oscillators have been rapidly downsized. In addition, semiconductors for controlling crystals have been rapidly downsized. A crystal oscillator typically has a power terminal (VCC1), a ground terminal (GND), a frequency output terminal (OUT) and a frequency control terminal (VC) (having no frequency control function in some cases). In addition, the crystal oscillator requires connection terminals (XT1, XT2) of a crystal vibrator.

In addition, a crystal oscillator performing oscillation with high precision contains a PROM circuit used to control a temperature-compensated circuit and so on (TCXO, VCXO, etc.).

TCXO performs high-precise oscillation through control to cancel frequency-temperature characteristics of crystals. Since different crystals have different frequency ununiformities, an adjustment is made to each of TCXOs, and the TCXOs perform temperature compensation based on adjustment data written in a PROM circuit contained in a control IC. Hereinafter, frequency adjustment of a TCXO using a ONE-time PROM will be described.

Existing frequency adjustment of TCXO requires three kinds of operation modes. Prior to use in mode typically used, in order to determine data to be written in a PROM circuit (write bits), there is a mode for inputting the data and acquiring and calculating frequency data (hereinafter referred to as an emulation mode (EM)). In addition, there is a mode for writing the data determined in the emulation mode (EM) in the PROM circuit (hereinafter referred to as a write mode (WM)). Then, in a mode typically used (hereinafter referred to as a read mode (RM)), the data written in the PROM mode is read out and frequency of the data is controlled. By switching between these three kinds of modes, frequency adjustment of TCXO is made.

A crystal oscillator performing oscillation with high precision in this manner requires dedicated control terminals for control in the above modes. For example, a CLK terminal, a DATA terminal and a PROM terminal are required for control of the PROM circuit. However, there is a need of common use of these terminals to further miniaturize the crystal oscillator.

As an example of the terminal common use, Patent Document 1 discloses a technique related to common use of a frequency control terminal and a DATA terminal and common use of an oscillation output terminal and a CLK terminal.

The present applicant has already suggested a TCXO module having a terminal (Vcc, CLK) 56 used for both of a power terminal and a CLK terminal and a terminal (DATA/VC) 52 used for both of a DATA terminal and a VC terminal (see Patent Document 2), as shown in FIG. 11. The TCXO module shown in FIG. 11 has 8 terminals in total, additionally including connection terminals XT 51 and XTB 55 of a crystal vibrator, a PROM voltage terminal 53, a write PE terminal 57, a ground terminal (GND) 54 and an oscillation output terminal (OUT) 58.

FIG. 23 is a schematic view showing a configuration of the temperature-compensated crystal oscillator disclosed in Patent Document 2. In FIG. 23, a power/CLK terminal 11A is a module power terminal through which a signal voltage of 2.8 V is supplied. In addition, this terminal 11A also serves as a CLK terminal through which a clock signal is delivered to a PROM circuit. A voltage control/DATA terminal 11A is a terminal for controlling a frequency with a voltage and serves to deliver data to the PROM circuit.

In this manner, this temperature-compensated crystal oscillator commonly uses the CLK terminal and the power terminal through which the clock signal is delivered to the PROM circuit, and commonly uses the voltage control terminal through which a voltage is applied to a voltage control circuit and the DATA terminal through which data are delivered to the PROM circuit.

FIG. 24 is a view showing adjustment data input waveforms in the temperature-compensated crystal oscillator. In adjustment, after a power terminal 5A is set to 2.3 V, a clock signal is delivered to a register of a control IC through the power terminal 11A and a data signal is delivered to the register through the terminal 12A. After the delivery of these signals, the control IC is fixedly set to a power voltage of 2.3 to 3.3 V used typically. In addition, a voltage of 0 V to 3.3 V in a voltage control range is applied to the terminal 12A for oscillating frequency adjustment.

If a memory is configured with a rewritable EEPROM, there may be provided, in some cases, no emulation mode if there is little margin for a chip area. In this case, since frequency data are taken, write is purposely performed and data are taken on every occasion. Thereafter, optimal bits are calculated based on the data. Subsequent operations are the same for any PROMs.

In this case, although a basic adjustment method is not changed, details of a method of taking data in emulation are as follows. Data of emulation are actually inputted. A frequency is no changed at this point of time. Next, write operation is performed. This allows data to be reflected on an output. Data are taken with repetition of this operation.

Patent Document 1: U.S. Pat. No. 5,724,009
Patent Document 2: JP-A-2003-188646

However, since the method disclosed in Patent Document 1 uses terminals in common with an analog signal and a digital signal, very complicate switching is required to adjust the crystal oscillator.

For example, for switching in common use of the OUT terminal and the CLK terminal, while a pulse generating power source is connected in CLK input, since a frequency counter for reading a frequency from the OUT terminal is required in a normal state, switching of connection is complicate.

In the meantime, when the PROM circuit is used to adjust the crystal oscillator, there is a need to input serial data in order to set the emulation mode (EM), thereby requiring the CLK terminal and the DATA terminal. In addition, terminals for switching between the read mode (RM), the emulation mode (EM) and the write mode (WM) are needed. The following description shows specific examples.

FIG. 12 shows a conventional TCXO control IC. The conventional TCXO control IC has power terminal 2 (VCC2: power for mode select) 62 in which mode switching is performed. For example, modes are distinguished from each other in such a manner that the read mode (RM) is used when the power terminal 2 (62) is open, the emulation mode (EM) is used when the power terminal 2 (62) is applied with 2.3 V, and the write mode (WM) is used when the power terminal 2 (62) is applied with 3.5 V.

In this manner, in switching between the read mode (RM), the emulation mode (EM) and the write mode (WM), the conventional TCXO control IC performs data input by providing a bias from the power terminal 2 (62) to a power terminal (PROM power VCC2: power for mode select). However, there is a need to further reduce PAD (terminal) of IC or terminals of a TCXO module to meet a demand for recent miniaturization.

SUMMARY OF THE INVENTION

In consideration of the above circumstances, it is an object of the present invention to provide a temperature-compensated crystal oscillator that is capable of using terminals in common without requiring switching of circuit connection for frequency adjustment.

According to a first aspect of the invention, there is provided an IC for control of a temperature-compensated crystal oscillator including a power terminal through which a power voltage and a clock signal are supplied, an input terminal through which a predetermined control signal is supplied, and a PROM circuit in which an adjustment data to cancel a temperature characteristic of the crystal oscillator are written, the crystal oscillator having a read mode for reading data written in the PROM circuit and controlling a frequency of the crystal oscillator, an emulation mode for determining data to be written in the PROM circuit, and a write mode for writing the data determined in the emulation mode in the PROM circuit, the IC including an internal clock generation circuit that outputs, as a clock signal, a result of comparison between a first signal in which the power voltage and the clock signal supplied through the power terminal are superimposed, and a predetermined reference voltage.

With this configuration, since a result of comparison between a first signal in which the power voltage and the clock signal supplied through the power terminal are superimposed, and a predetermined reference voltage is outputted as a clock signal, the terminals can be used in common with no need of switching of circuit connection for frequency adjustment.

According to a second aspect of the invention, there is provided an IC for control of a temperature-compensated crystal oscillator including a power terminal through which a power voltage and a clock signal are supplied, an input terminal through which a predetermined control signal is supplied, and a PROM circuit in which an adjustment data to cancel a temperature characteristic of the crystal oscillator are written, the crystal oscillator having a read mode for reading data written in the PROM circuit and controlling a frequency of the crystal oscillator, an emulation mode for determining data to be written in the PROM circuit, and a write mode for writing the data determined in the emulation mode in the PROM circuit, the IC including a first mode selector circuit that switches the crystal oscillator to the emulation mode or the write mode when a first signal in which the power voltage and the clock signal supplied through the power terminal are superimposed, is inputted from the power terminal and a second signal having a predetermined pattern is inputted from the input terminal.

With this configuration, since the crystal oscillator switches to the emulation mode when a first signal, in which the power voltage and the clock signal supplied through the power terminal are superimposed, is inputted from the power terminal and a second signal having a predetermined pattern is inputted from the input terminal for terminal common use, the terminals can be used in common with no need of switching of circuit connection for frequency adjustment. In addition, possibility of malfunction due to terminal common use can be reduced.

Preferably, in the IC for control of a temperature-compensated crystal oscillator according to the invention, a level of the first signal has a voltage higher than a voltage in a normal operation.

With this configuration, since a level of the first signal has a voltage (for example, 3.5 V to 5.5 V) higher than a voltage of 2.3 V to 3.3 V used actually in the IC for control of the temperature-compensated crystal oscillator, a mode cab be stably set.

Preferably, in the IC for control of a temperature-compensated crystal oscillator according to the invention, the first mode selector circuit includes a comparator that outputs, as a pulse signal, a result of comparison between the first signal and a predetermined reference voltage; predetermined stages of first flip-flop circuit that shifts the second signal based on the pulse signal outputted from the comparator; and a transistor that controls the power voltage based on an output signal of the first flip-flop circuit.

With this configuration, the terminals can be used in common with no need of switching of circuit connection for frequency adjustment. In addition, possibility of malfunction due to terminal common use can be reduced.

Preferably, the IC for control of a temperature-compensated crystal oscillator according to the invention further includes a logic circuit that controls the transistor when outputs of the stages of the first flip-flop circuit match the predetermined pattern.

With this configuration, since the transistor is controlled when outputs of the stages of the first flip-flop circuit match the predetermined pattern, possibility of malfunction due to terminal common use can be reduced.

Preferably, the IC for control of a temperature-compensated crystal oscillator according to the invention further includes a control logic circuit that set data to be written in the PROM circuit in the emulation mode or the write mode, the control logic circuit being operated when the power voltage is controlled by the first mode selector circuit or a signal.

With this configuration, since the control logic circuit is operated when the power voltage is supplied from the first mode selector circuit, it is possible to prevent the crystal oscillator from entering the emulation mode (EM) and preventing data from being incorrectly written in the PROM circuit due to noise and the like.

Preferably, in the IC for control of a temperature-compensated crystal oscillator according to the invention, the control logic circuit includes predetermined stages of second flip-flop circuit that shifts the second signal based on the clock signal.

With this configuration, since the second flip-flop circuit shifts the second signal when the power voltage is supplied from the first mode selector circuit, it is possible to prevent the crystal oscillator from entering the emulation mode (EM) and preventing data from being incorrectly written in the PROM circuit due to noise and the like.

Preferably, in the IC for control of a temperature-compensated crystal oscillator according to the invention, the PROM circuit includes a plurality of serial-connected diodes that are connected in series to the input terminal and limit an amplitude of a write data signal.

With this configuration, since the PROM circuit includes a plurality of serial-connected diodes that limit an amplitude of a write data signal, it is possible to use the PE terminal and the input terminal in common with the PE terminal and the input terminal electrically isolated from each other.

According to a third aspect of the invention, there is provided an IC for control of a temperature-compensated crystal oscillator including a power terminal through which a power voltage and a clock signal are supplied, an input terminal through which a predetermined control signal is supplied, and a PROM circuit in which adjustment data to cancel a temperature characteristic of the crystal oscillator are written, the crystal oscillator having a read mode for reading data written in the PROM circuit and controlling a frequency of the crystal oscillator, an emulation mode for determining data to be written in the PROM circuit, and a write mode for writing the data determined in the emulation mode in the PROM circuit, the IC including a mode selector circuit that switches the crystal oscillator to the emulation mode or the write mode when a signal in which the power voltage and the clock signal supplied through the power terminal are superimposed, is inputted from the power terminal.

With this configuration, since the IC includes a mode selector circuit that switches the crystal oscillator to the emulation mode when a signal in which the power voltage and the clock signal supplied through the power terminal are superimposed, is inputted from the power terminal, the terminals can be used in common with no need of switching of circuit connection for frequency adjustment.

Preferably, the IC for control of a temperature-compensated crystal oscillator further includes 6 terminals including a first terminal through which the first signal is supplied, and a second terminal through which the second signal is supplied. In addition, the IC further includes 6 terminals including a terminal through which a signal, in which the power voltage and the clock signal supplied through the power terminal are superimposed, is supplied through the power terminal.

With this configuration, since terminals of the temperature-compensated crystal oscillator can be reduced from conventional 8 pads to 6 pads, it is possible to reduce the number of pattern wirings connecting the TCXO module to the IC, thereby realizing miniaturization of the TCXO module.

According to a fourth aspect of the invention, there is provided an IC for control of a temperature-compensated crystal oscillator including an output terminal through which an oscillator output and a clock signal are supplied, an input terminal through which a predetermined control signal is supplied, and a PROM circuit in which adjustment data to cancel a temperature characteristic of the crystal oscillator are written, the crystal oscillator having a read mode for reading data written in the PROM circuit and controlling a frequency of the crystal oscillator, an emulation mode for determining data to be written in the PROM circuit, and a write mode for writing the data determined in the emulation mode in the PROM circuit, the IC including a first mode selector circuit that switches the crystal oscillator to the emulation mode or the write mode when a first signal, which is superimposed with the clock signal, is inputted from the output terminal and a second signal having a predetermined pattern is inputted from the input terminal.

With this configuration, since the crystal oscillator switches to the emulation mode when a first signal in which the power voltage and the clock signal supplied through the power terminal are superimposed, is inputted from the power terminal and a second signal having a predetermined pattern is inputted from the input terminal for terminal common use, the terminals can be used in common with no need of switching of circuit connection for frequency adjustment. In addition, possibility of malfunction due to terminal common use can be reduced.

According to a fifth aspect of the invention, there is provided an IC for control of a temperature-compensated crystal oscillator including an output terminal through which an oscillator output and a clock signal are supplied, an input terminal through which a predetermined control signal is supplied, and a PROM circuit in which adjustment data to cancel a temperature characteristic of the crystal oscillator are written, the crystal oscillator having a read mode for reading data written in the PROM circuit and controlling a frequency of the crystal oscillator, an emulation mode for determining data to be written in the PROM circuit, and a write mode for writing the data determined in the emulation mode in the PROM circuit, the IC including a mode selector circuit that switches the crystal oscillator to the emulation mode or the write mode when a signal, which is superimposed with the clock signal, is inputted from the output terminal.

With this configuration, since the IC includes a mode selector circuit that switches the crystal oscillator to the emulation mode when a signal in which the power voltage and the clock signal supplied through the power terminal are superimposed, is inputted from the power terminal, the terminals can be used in common with no need of switching of circuit connection for frequency adjustment.

According to a sixth aspect of the invention, there is provided an IC for control of a temperature-compensated crystal oscillator including an input terminal through which a control signal of the crystal oscillator and a clock signal are supplied, an output terminal of the crystal oscillator, and a PROM circuit in which adjustment data to cancel a temperature characteristic of the crystal oscillator are written, the crystal oscillator having a read mode for reading data written in the PROM circuit and controlling a frequency of the crystal oscillator, an emulation mode for determining data to be written in the PROM circuit, and a write mode for writing the data determined in the emulation mode in the PROM circuit, the IC including a first mode selector circuit that switches the crystal oscillator to the emulation mode or the write mode when a first signal, which is superimposed with the clock signal, is inputted from the input terminal and a second signal having a predetermined pattern is inputted from the output terminal.

With this configuration, the terminals can be used in common with no need of switching of circuit connection for frequency adjustment.

According to a seventh aspect of the invention, there is provided an IC for control of a temperature-compensated crystal oscillator including an input terminal through which a control signal of the crystal oscillator and a clock signal are supplied, an output terminal of the crystal oscillator, and a PROM circuit in which adjustment data to cancel a temperature characteristic of the crystal oscillator are written, the crystal oscillator having a read mode for reading data written in the PROM circuit and controlling a frequency of the crystal oscillator, an emulation mode for determining data to be written in the PROM circuit, and a write mode for writing the data determined in the emulation mode in the PROM circuit, the IC including a first mode selector circuit that switches the crystal oscillator to the emulation mode or the write mode when a signal, which is superimposed with the clock signal, is inputted from the input terminal.

With this configuration, the terminals can be used in common with no need of switching of circuit connection for frequency adjustment.

According to an eighth aspect of the invention, there is provided an IC for control of a temperature-compensated crystal oscillator including a power terminal through which a power voltage and a clock signal are supplied, an output terminal of the crystal oscillator, and a PROM circuit in which adjustment data to cancel a temperature characteristic of the crystal oscillator are written, the crystal oscillator having a read mode for reading data written in the PROM circuit and controlling a frequency of the crystal oscillator, an emulation mode for determining data to be written in the PROM circuit, and a write mode for writing the data determined in the emulation-mode in the PROM circuit, the IC including a first mode selector circuit that switches the crystal oscillator to the emulation mode or the write mode when a first signal, which is superimposed with the clock signal, is inputted from the power terminal and a second signal having a predetermined pattern is inputted from the output terminal.

With this configuration, the terminals can be used in common with no need of switching of circuit connection for frequency adjustment.

According to a ninth aspect of the invention, there is provided an IC for control of a temperature-compensated crystal oscillator including a power terminal through which a power voltage and a clock signal are supplied, an output terminal of the crystal oscillator, and a PROM circuit in which adjustment data to cancel a temperature characteristic of the crystal oscillator are written, the crystal oscillator having a read mode for reading data written in the PROM circuit and controlling a frequency of the crystal oscillator, an emulation mode for determining data to be written in the PROM circuit, and a write mode for writing the data determined in the emulation mode in the PROM circuit, the IC including a first mode selector circuit that switches the crystal oscillator to the emulation mode or the write mode when a signal, which is superimposed with the clock signal, is inputted from the power terminal.

With this configuration, the terminals can be used in common with no need of switching of circuit connection for frequency adjustment.

According to a tenth aspect of the invention, there is provided an IC for control of a temperature-compensated crystal oscillator including a crystal terminal to which the crystal oscillator is connected, a crystal terminal to which a clock signal is supplied, an input terminal of the crystal oscillator, and a PROM circuit in which an adjustment data to cancel a temperature characteristic of the crystal oscillator are written, the crystal oscillator having a read mode for reading data written in the PROM circuit and controlling a frequency of the crystal oscillator, an emulation mode for determining data to be written in the PROM circuit, and a write mode for writing the data determined in the emulation mode in the PROM circuit, the IC including a first mode selector circuit that switches the crystal oscillator to the emulation mode or the write mode when a first signal, which is superimposed with the clock signal, is inputted from the crystal terminal and a second signal having a predetermined pattern is inputted from the input terminal.

With this configuration, the terminals can be used in common with no need of switching of circuit connection for frequency adjustment.

According to an eleventh aspect of the invention, there is provided an IC for control of a temperature-compensated crystal oscillator including a crystal terminal to which the crystal oscillator is connected, a crystal terminal to which a clock signal is supplied, an input terminal of the crystal oscillator, and a PROM circuit in which an adjustment data to cancel a temperature characteristic of the crystal oscillator are written, the crystal oscillator having a read mode for reading data written in the PROM circuit and controlling a frequency of the crystal oscillator, an emulation mode for determining data to be written in the PROM circuit, and a write mode for writing the data determined in the emulation mode in the PROM circuit, the IC including a first mode selector circuit that switches the crystal oscillator to the emulation mode or the write mode when a first signal, which is superimposed with the clock signal, is inputted from the crystal terminal.

With this configuration, the terminals can be used in common with no need of switching of circuit connection for frequency adjustment.

According to the present invention, the terminals can be used in common with no need of switching of circuit connection for frequency adjustment. Accordingly, it is possible to reduce the number of pattern wirings connecting the TCXO module to the IC, thereby realizing miniaturization of the TCXO module.

BRIEF DESCRIPTION OF THE DRAWINGS

FIG. 7 is a view showing an example of an input waveform according to the first embodiment of the present invention.

FIG. 20 is a view showing an example of an input waveform according to the third embodiment of the present invention.

FIG. 30 is a view showing an example of an input waveform according to the fourth embodiment of the present invention.

FIG. 36 is a view showing an example of an input waveform according to the fifth embodiment of the present invention.

FIG. 44 is a view showing an example of an input waveform according to the sixth embodiment of the present invention.

DESCRIPTION OF THE PREFERRED EMBODIMENTS

Hereinafter, a method of efficiently using a DATA terminal, a CLK terminal and a control circuit power terminal of an IC for control of a temperature-compensated crystal oscillator (TCXO) without requiring switching for frequency adjustment will be described with reference to the drawings.

First Embodiment

Figure 1:
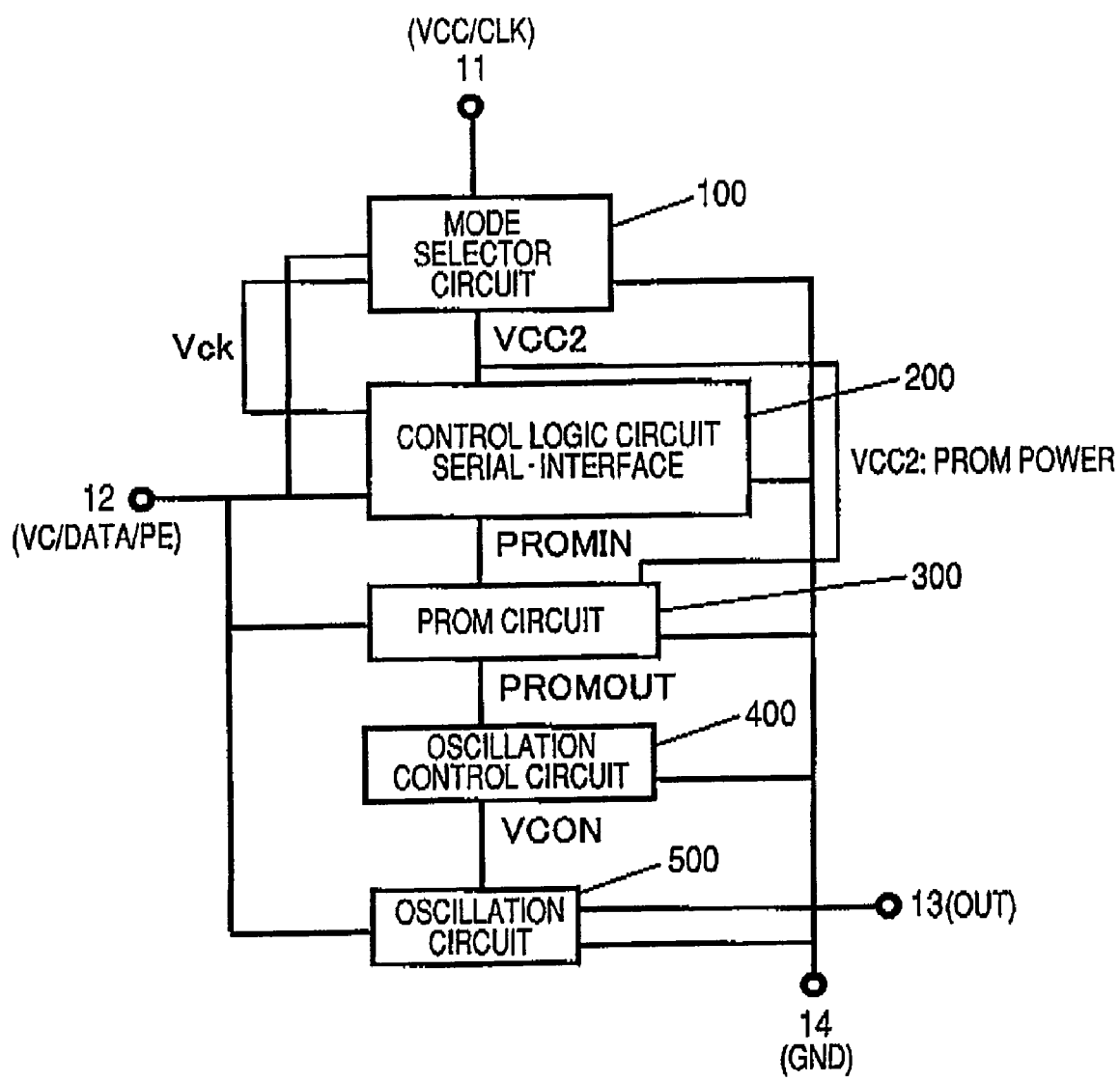
FIG. 1 is a block diagram (1) of an IC for TCXO according to a first embodiment of the present invention.

FIG. 1 is a block diagram (1) of an IC for TCXO according to a first embodiment of the present invention. In this embodiment, an IC for control of TCXO includes a mode selector circuit 100, a control logic serial•interface 200, a PROM circuit 300, an oscillation control circuit 400 and an oscillation circuit 500, and has, as terminals, a power terminal (VCC/CLK) 11, an input terminal (VC/DATA/PE) 12, an output terminal (OUT) 13 and a ground terminal (GND) 14.

The power terminal (VCC/CLK) 11 is connected to the mode selector circuit 100. The input terminal (VC/DATA/PE) 12 is connected to the mode selector circuit 100, the control logic circuit 200 and the oscillation circuit 500. The output terminal (OUT) 13 is connected to the oscillation circuit 500 through which oscillation output of several tens MHz is performed.

Figure 12:
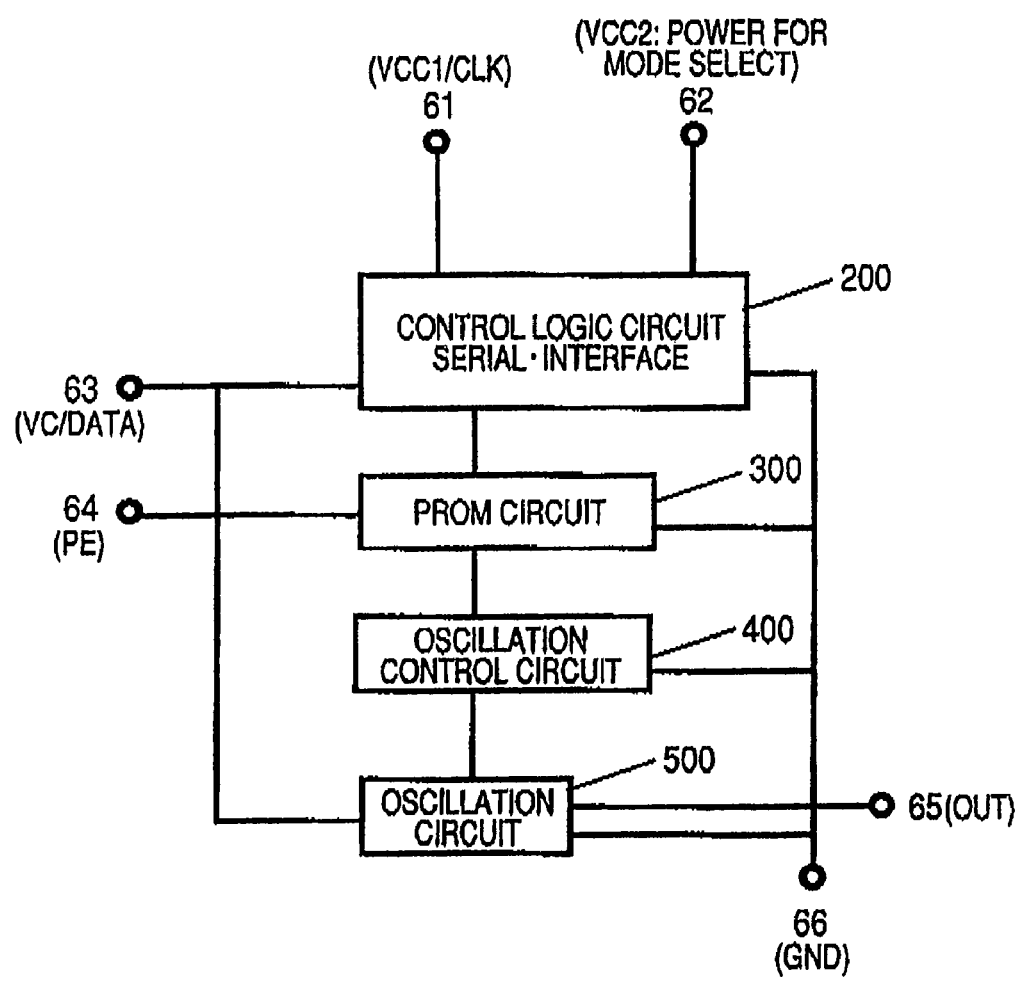
FIG. 12 is a block diagram of a conventional IC for TCXO.

The TCXO control IC of this embodiment shown in FIG. 1 includes further the mode selector circuit 100 in addition to the conventional TCXO control IC shown in FIG. 12.

Figure 2:
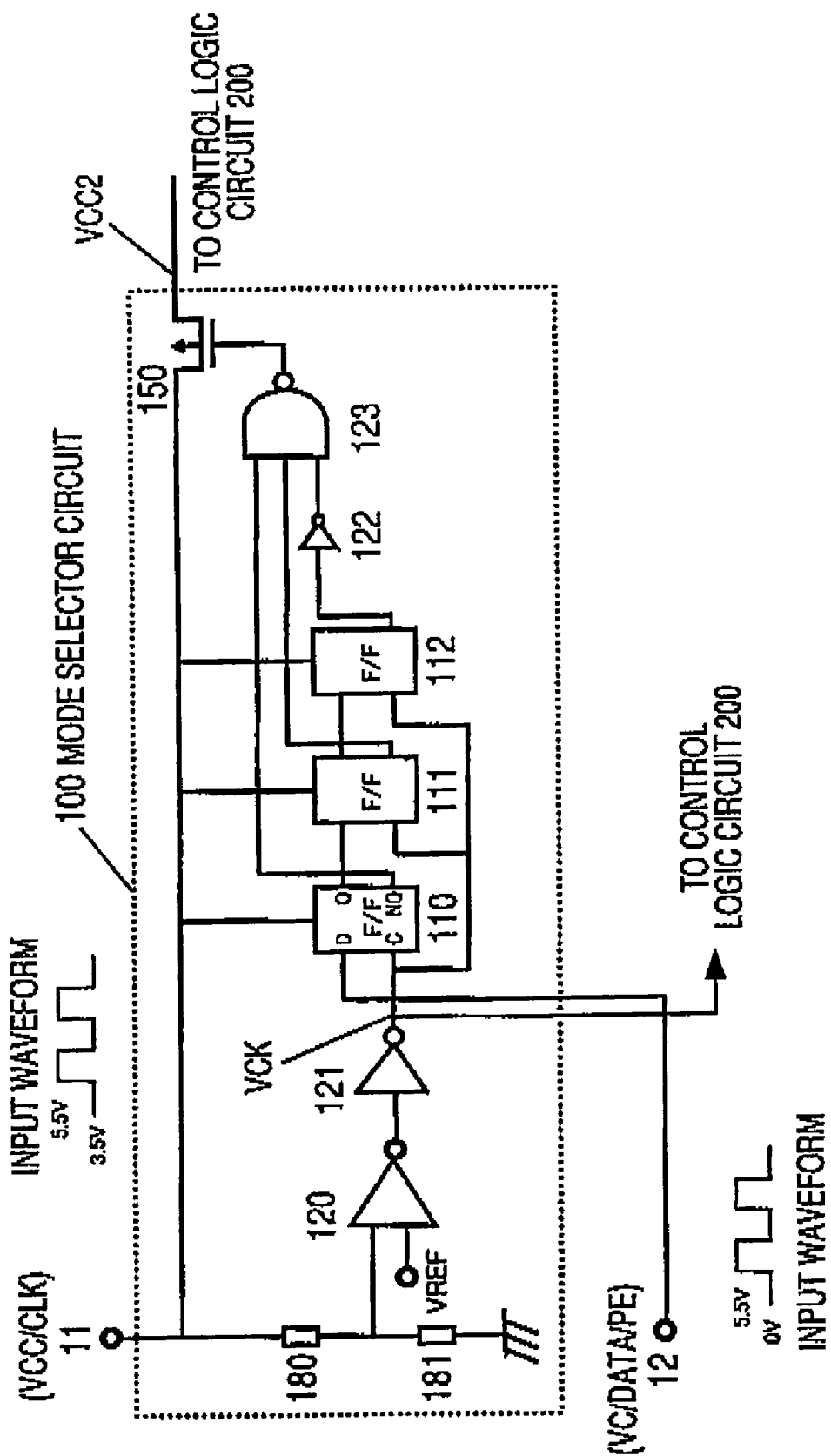
FIG. 2 is a block diagram of a mode selector circuit according to the first embodiment of the present invention.

FIG. 2 is a block diagram of the mode selector circuit 100. The mode selector circuit 100 has a comparator 120 with an internal reference voltage VREF of the IC as a reference, and a CLK signal of, for example, 3.5 V to 5.5 V is inputted to the comparator 120 through the power terminal (VCC/CLK) 11. The input of the comparator 120 is adjusted by dividing the voltage of the CLK signal by means of a resistor 180 and a resistor 118. That is, the comparator 120 outputs, as a pulse signal, a result of comparison between a voltage of a signal inputted through the power terminal (VCC/CLK) 11 (a voltage divided by means of the resistor 180 and the resistor 181) and the internal reference voltage VREF of the IC. Accordingly, a signal of 0 V to VCC can be obtained as an input VCK of an F/F circuit 110.

On the other hand, data of 0 V to 5.5 V are inputted through the input terminal (VC/DATA/PE) 12. The data are delivered to F/F circuits 110 to 112, with the date superimposed with the CLK signal from the power terminal (VCC/CLK) 11.

When a specified signal is inputted to the F/F circuits 110 to 112, a transistor M1 (150) is turned ON to raise a power voltage VCC2 and power is supplied to the control logic circuit serial•interface 200, thereby switching to an emulation mode (EM).

According to this embodiment, the power terminal 1 (VCC/CLK) 61 and the power terminal 2 (VC2: power for mode select) 62 shown in FIG. 12 are used in common as the power terminal (VCC/CLK) 11 shown in FIG. 1, and mode switching is performed by signals from the power terminal (VCC/CLK) 11 and the input terminal (VC/DATA/PE) 12. Accordingly, for a typical TCXO, its mode may wrongly switch to the emulation mode (EM) due to noise or the like. Thus, in this embodiment, the mode switching is performed only when a specific signal pattern is inputted to the input terminal (VC/DATA/PE) 12, thereby making it possible to prevent the IC from malfunctioning.

In this manner, in this embodiment, the mode selector circuit 100 controls the mode switching in such a manner that a mode switches to another mode when the specified signals are supplied from the power-terminal (VCC/CLK) 11 and the input terminal (VC/DATA/PE) 12.

At this time, a LOW level of the input of the power terminal (VCC/CLK) 11 is set to a voltage causing signals of control logic and serial control to be operable. Here, if the LOW level of the power terminal (VCC/CLK) 11 is set to 0 V, the serial control is naturally ineffective. Accordingly, for example, a mode is set by applying a voltage of 3.5 V to 5.5 V to the power terminal (VCC/CLK) 11.

To this end, the comparator 120 is provided under the power terminal (VCC/CLK) 11 and has, as its inverted input, the reference voltage VREF and has, as its non-inverted input, a voltage obtained by dividing the power voltage VCC by means of the resistor 180 and the resistor 181.

A threshold level VREF of the comparator 120 is set to 3 V and a resistance ratio of the power terminal (VCC/CLK) 11 is adjusted to switch the power voltage VCC to 4.5 V. In actual, under application of the power voltage VCC of 3.5 V to 5.5 V, a stable CLK pulse of 0 V to VCC can be produced at a VCK point which is an output of an inverter 121.

When the mode selector circuit 100 is inputted with the CLK signal from the power terminal (VCC/CLK) 11 and a DATA signal containing specified data from the input terminal (VC/DATA/PE) 12, the transistor M1 (150) is turned ON so that the power voltage VCC2 becomes equal to the power voltage VCC, thereby powering ON the control logic circuit 200.

With the mode setting completed, the transistor M1 (150) is turned ON to be applied with the power voltage VCC2, thereby making it possible to control the control logic circuit serial•interface 200. This allows switching to the emulation mode (EM).

The mode selector circuit 100 is provided with several stages of F/F circuits 110 to 112 in order not to perform an emulation operation if a certain bit is not inputted thereto, so that an operation mode does not switch to the emulation mode (EM) wrongly when a signal is inputted to the power terminal (VCC/CLK) 11 and the input terminal (VC/DATA/PE) 12 in actual use. Increase of the number of stages of F/F circuits 110 to 112 is more effective for preventing the IC from malfunctioning.

After a signal with a certain bit is inputted for switching to the emulation mode (EM), frequency data for adjustment of a crystal frequency with a signal of 3.5 V to 5.5 V may be taken.

Figure 13:
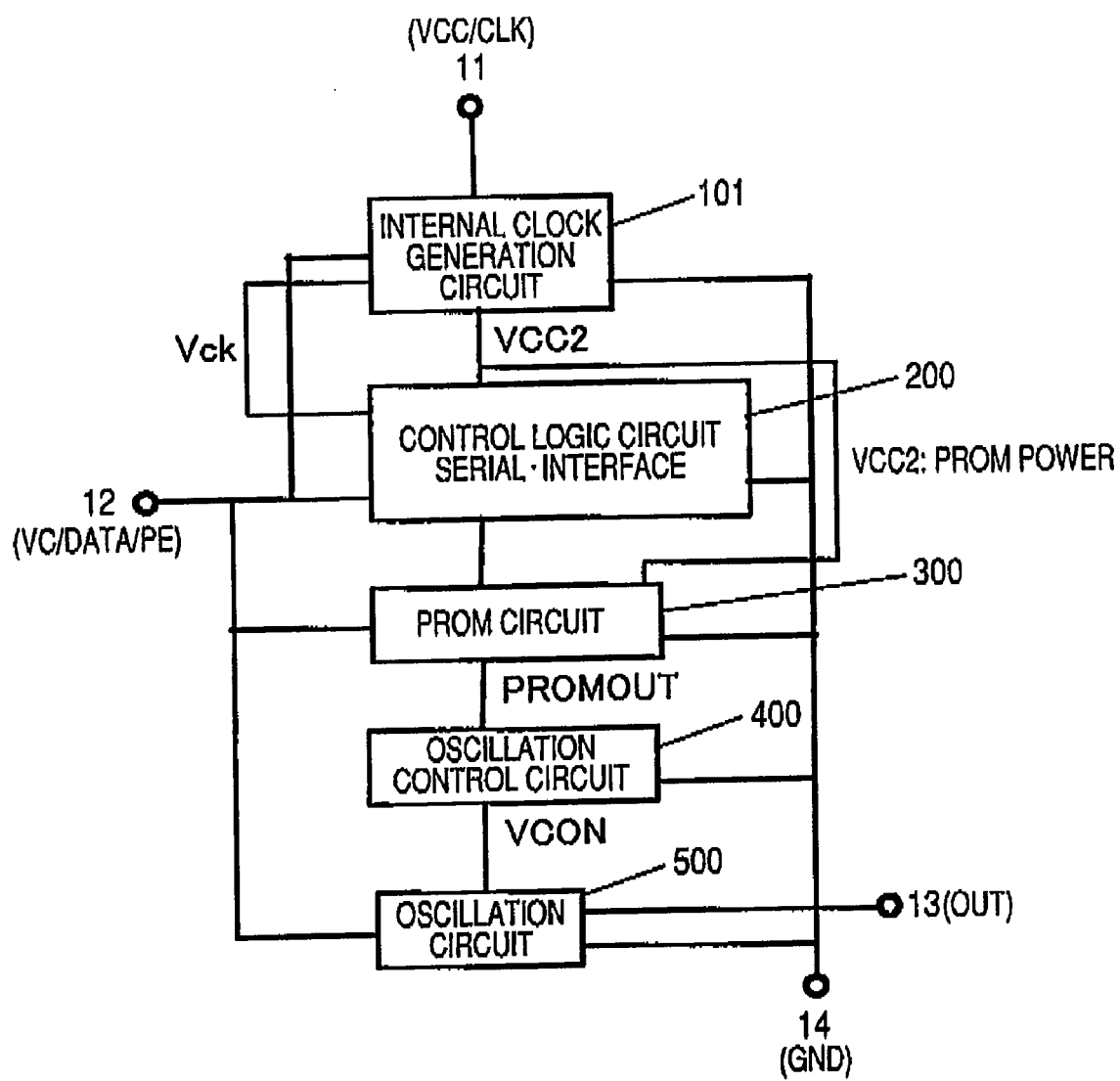
FIG. 13 is a block diagram (3) of an IC for TCXO according to the first embodiment of the present invention.
Figure 14:
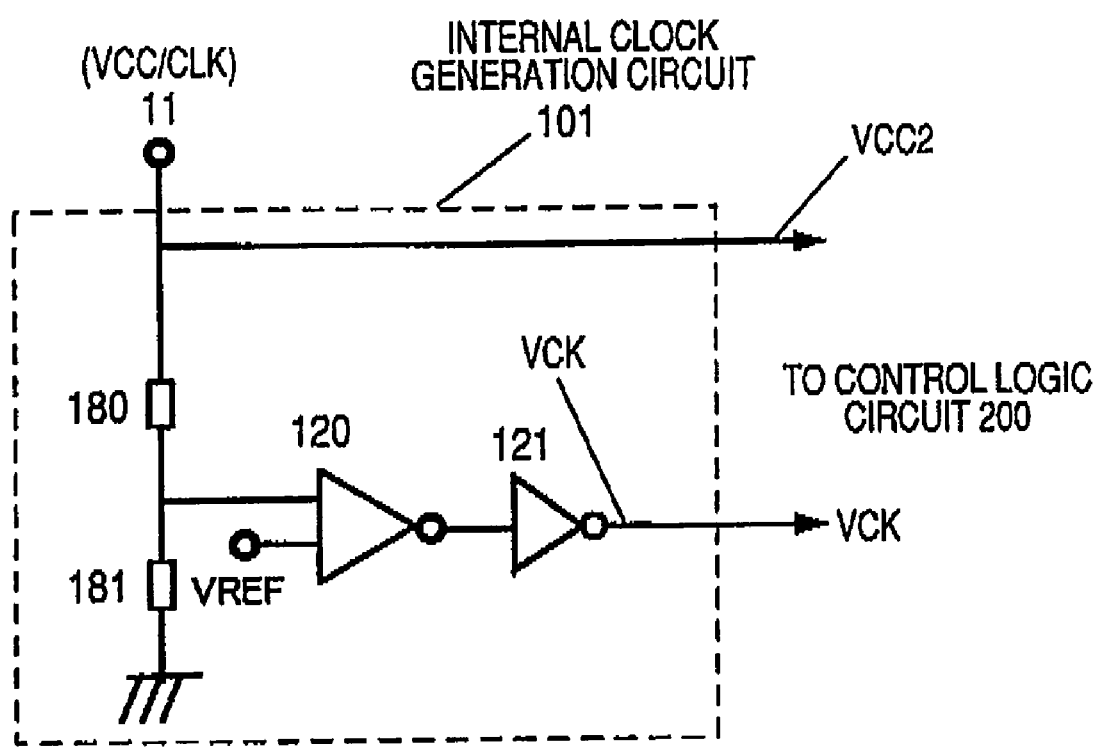
FIG. 14 is a block diagram of an internal clock generation circuit according to the first embodiment of the present invention.

In case of no noise, the F/F circuits 110 to 112 of the mode selector circuit 100 may be omitted. FIG. 13 is a block diagram of a TCXO control IC having an internal clock generation circuit 101 instead of the mode selector circuit 100 shown in FIG. 1. FIG. 14 is a block diagram of the internal clock generation circuit 101.

The internal clock generation circuit 101 has a comparator 120 with an internal reference voltage VREF of the IC as a reference, and a CLK signal of, for example, 3.5 V to 5.5 V is inputted to the comparator 120 through the power terminal (VCC/CLK) 11. The input of the comparator 120 is adjusted by dividing the voltage of the CLK signal by means of a resistor 180 and a resistor 181. That is, the comparator 120 outputs, as a clock signal VCK, a result of comparison between a voltage of a signal inputted through the power terminal (VCC/CLK) 11 (a voltage divided by means of the resistor 180 and the resistor 181) and the internal reference voltage VREF of the IC. Accordingly, a clock signal VCK of 0 V to VCC to be supplied to the control logic circuit 200 can be obtained.

Figure 3:
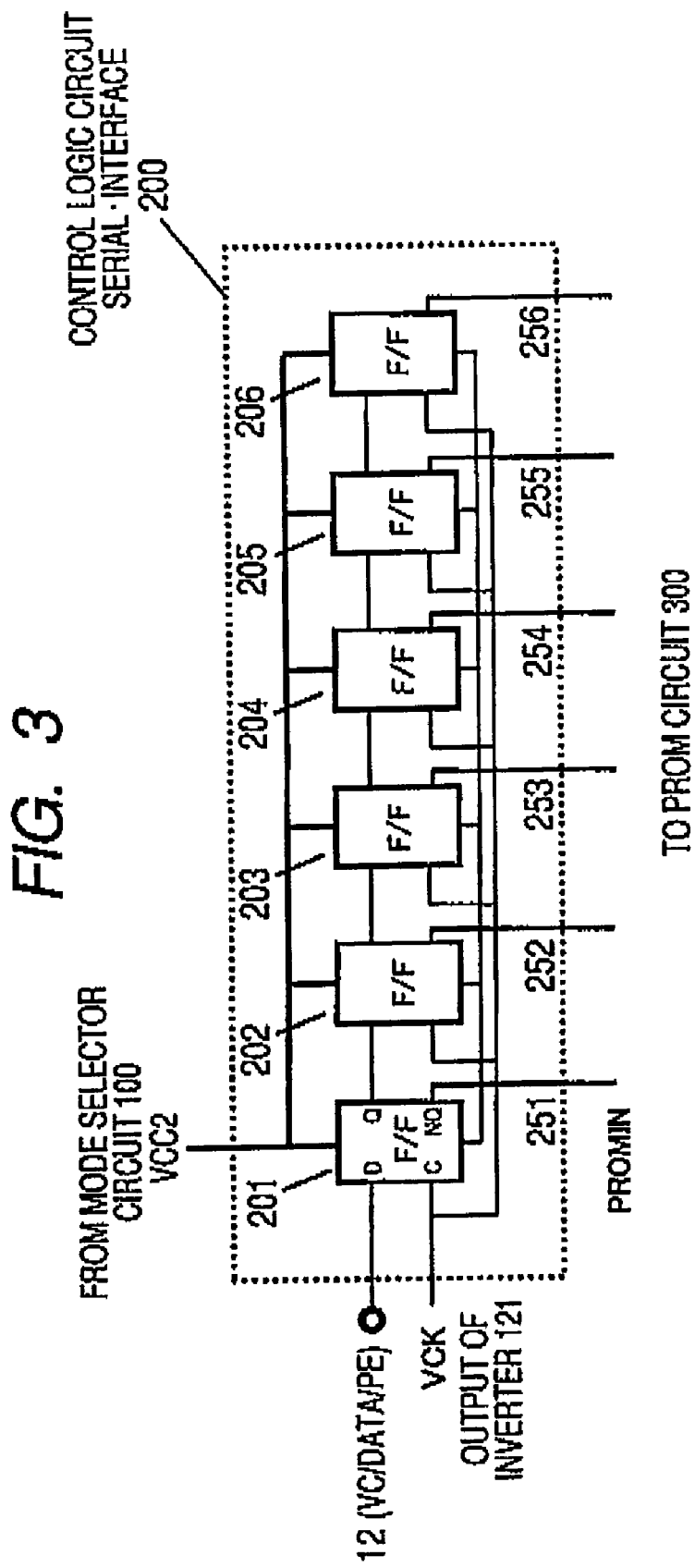
FIG. 3 is a block diagram of a control logic unit according to the first embodiment of the present invention.

FIG. 3 is a block diagram of the control logic circuit serial•interface 200. When the power voltage VCC2 is raised in the mode selector circuit 100, power is supplied to the control logic circuit serial•interface 200, thereby making the emulation mode (EM) operable.

A signal VCK is inputted to an input clock of the control logic circuit serial•interface 200 and DATA is inputted from the input terminal (VC/DATA/PE) 12. The inputted DATA include a plurality of PROM bit data to be delivered to the PROM circuit 300.

These data have the number of bits, typically 40 to 60 bits, required for adjustment of a frequency-temperature characteristic of a crystal vibrator or an oscillator output.

Figure 4:
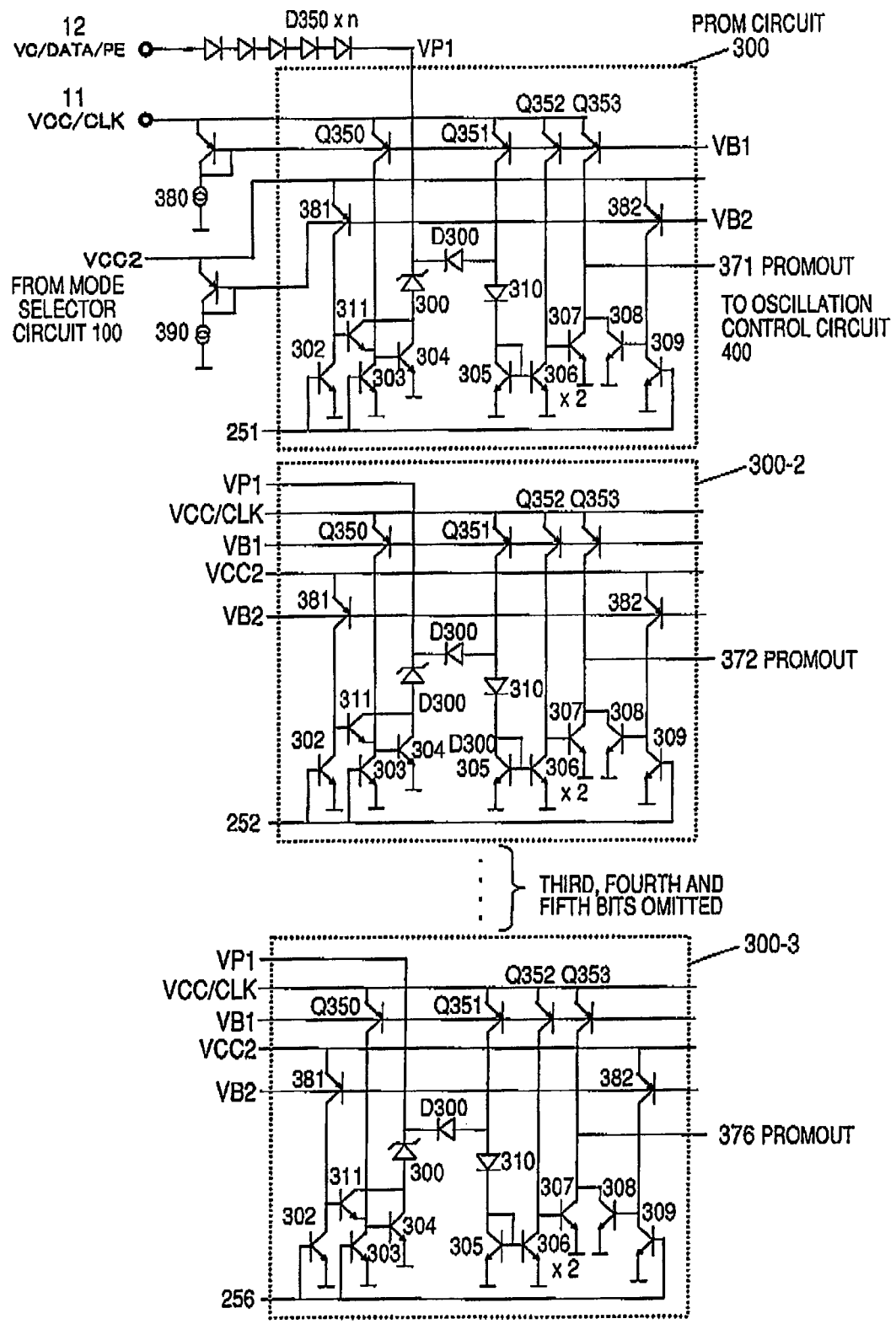
FIG. 4 is a block diagram of a PROM circuit according to the first embodiment of the present invention.

FIG. 4 shows the PROM circuit 300. An output 251 from an F/F circuit 201 of the control logic circuit serial•interface 200 is inputted to the PROM circuit 300. PROMOUT is switched by a signal from the F/F circuit 201 and a signal is inputted to the oscillation control circuit 400 to control a frequency. Here, an adjusted desired frequency is written in the PROM circuit 300 from the input terminal (VC/DATA/PE) 12.

If there exists a write terminal (PE terminal) of the PROM circuit 300, the write terminal is used in common with the input terminal (VC terminal). In this embodiment, as shown in FIG. 4, by connecting a plurality (D350×n) of diodes in series to the PE terminal (input terminal 12) and separating a PROM circuit function side from other function sides in a DC manner, the common use of the PE terminal and the VC terminal is realized. If a PROM write operation that writes from the PE terminal of the PROM circuit function side is not compatible with a VCO operation for frequency from the VC terminal of other function sides, the common use can not be realized. The VC terminal needs impedance of more than 1 MΩ for common use and requires to be operated up to near 3 V with VCO. Conventional simple connection of the VC terminal to the PE terminal cannot raise a voltage of the VC terminal since impedance of the VC terminal is clamped by a diode of D350 (n=1). Thus, the VC terminal can obtain an operation range of n×0.7 V by interconnecting n D350 diodes in series. Pileup of the D350 diodes has no problem if a withstanding voltage of the PE terminal is sufficient in a write operation. For example, for operation of the VC terminal up to 5 V, since n (8)×0.7 V=5.6 V, common use of PAD can be realized by piling up 8 diodes.

In a read mode (RM), the PROM circuit 300 operates with a current mirror composed of a constant current source I380, Since a current mirror composed of I390 is in a state where VCC2 is not raised, current is zero. Q304 is turned ON by current of Q350 so as to set an anode of Z300 to LOW. A PROMOUT state is changed depending on whether current of Q351 flows into Z300 through D300 or Q305 through D310. That is, PROMOUT is determined in the Z300 state. Hereinafter, respective states will be described.

For example, if a zener diode of Z300 is circuit-shorted by applying current from the PE terminal to the zener diode, the current from Q351 flows into Z300 and current does not flow into Q310/305/306, In addition, Q307 is turned ON by current of Q352 and PROMOUT goes to LOW.

In addition, if Z300 has high impedance when viewed from its cathode, the current of Q351 flows into Q310/3051306, all current of Q352 is drawn in, and Q307 is turned OFF to set PROMOUT to HIGH.

In the emulation mode (EM), a voltage is applied to the VCC/CLK terminal and VCC2, current flows into I380/I390, and VB1 and VB2 lines become base lines of a constant current source. In this state, PROMOUT is controlled by a signal 251 from PROMIN.

If the signal 251 is HIGH, since Q303 is turned ON and then Q304 is turned OFF, current of Q351 flows into D310. The current of Q351 is doubled with a current mirror of Q305 and Q306. In addition, since current of Q352 is equal to the current of Q351, a base of Q307 becomes LOW and Q307 is turned OFF to set PROMOUT to HIGH. If the signal 251 is LOW, Q309 is turned OFF and current of Q382 flows into a base of Q308. Q308 is turned ON and PROMOUT goes to a LOW state. In this manner, by putting data from the signal 251 into a signal 256, an emulation operation can be performed.

In the write mode (WM), a voltage is applied to the VCC/CLK terminal and VCC2, and under a condition when current flows into I380/I390, VB1 and VB2 lines become base lines of a constant current source. In this mode, with a transistor Q304 under Z300 of a memory device turned ON irrespective of PROMOUT, current from the PE terminal flows and an operation of writing the PROM is performed. The signal 251 is set to LOW to select a write bit of the PROM. Accordingly, the current of Q350 is supplied to a base of Q304 to turn ON Q304. From this state, current is applied from the PE terminal to Z300 to put Z300 into a circuit-short state. At this time, when a HIGH signal is inputted to another bit from the signal 252 to the signal 256 and Q304 of a PROM circuit 300-2 and a PROM circuit 300-3 is turned OFF, there is no write even if VPI is connected to all bits.

When N diodes D350 are interconnected in series to electrically separate the PE terminal from the input terminal, it is possible to use the PE terminal and the input terminal in common. In addition, the number of diodes D350 to be interconnected in series depends on an input D range of a desired VC terminal. For example, when VC=2.4 V, with a forward voltage of D350 set to 0.7 V, it is possible to raise the VC voltage up to 2.8 V (=0.7×4) with four diodes of D350 interconnected in series.

Figure 5A:
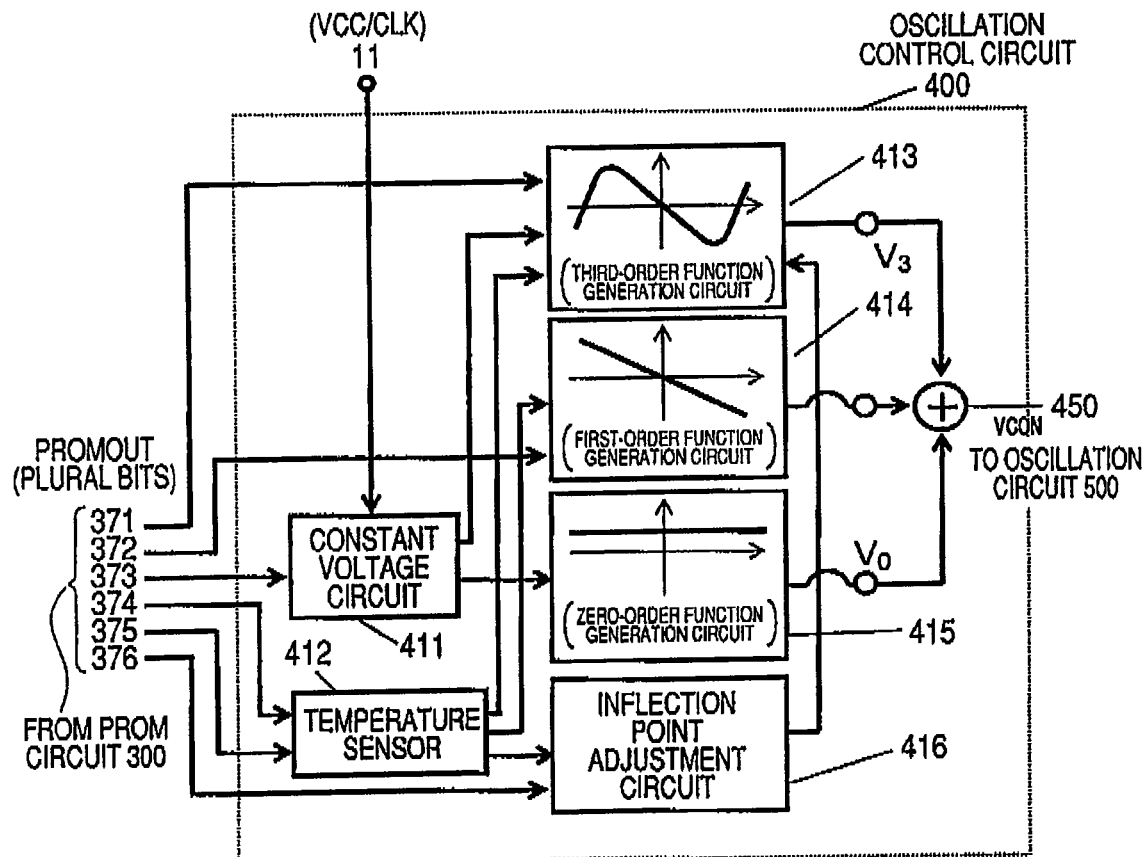
FIG. 5 is a view showing an outline of a frequency control circuit according to the first embodiment of the present invention.

FIG. 5A is a block diagram of the oscillation control circuit 400, showing a third-order function generation circuit to compensate a temperature characteristic of a crystal. In this figure, a third-order function (α) block, a first-order function (β) block, a zero-order function (γ) block and an inflection point (T0) block are shown. The resultant output is outputted to 450. A characteristic of the result output may be expressed by the following equation 1.

$$VCON = \alpha(Ta-T0)^3 + \beta(Ta-T0) + \gamma \qquad \text{(Equation 1)}$$

Figure 5B:
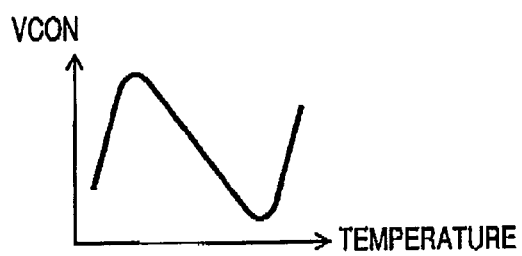

A plurality of PROM circuits to control α, β, γ and T0 are provided. A temperature characteristic of a third-order control voltage VCON output of the oscillation control circuit 400 is shown in FIG. 5B.

Figure 6:
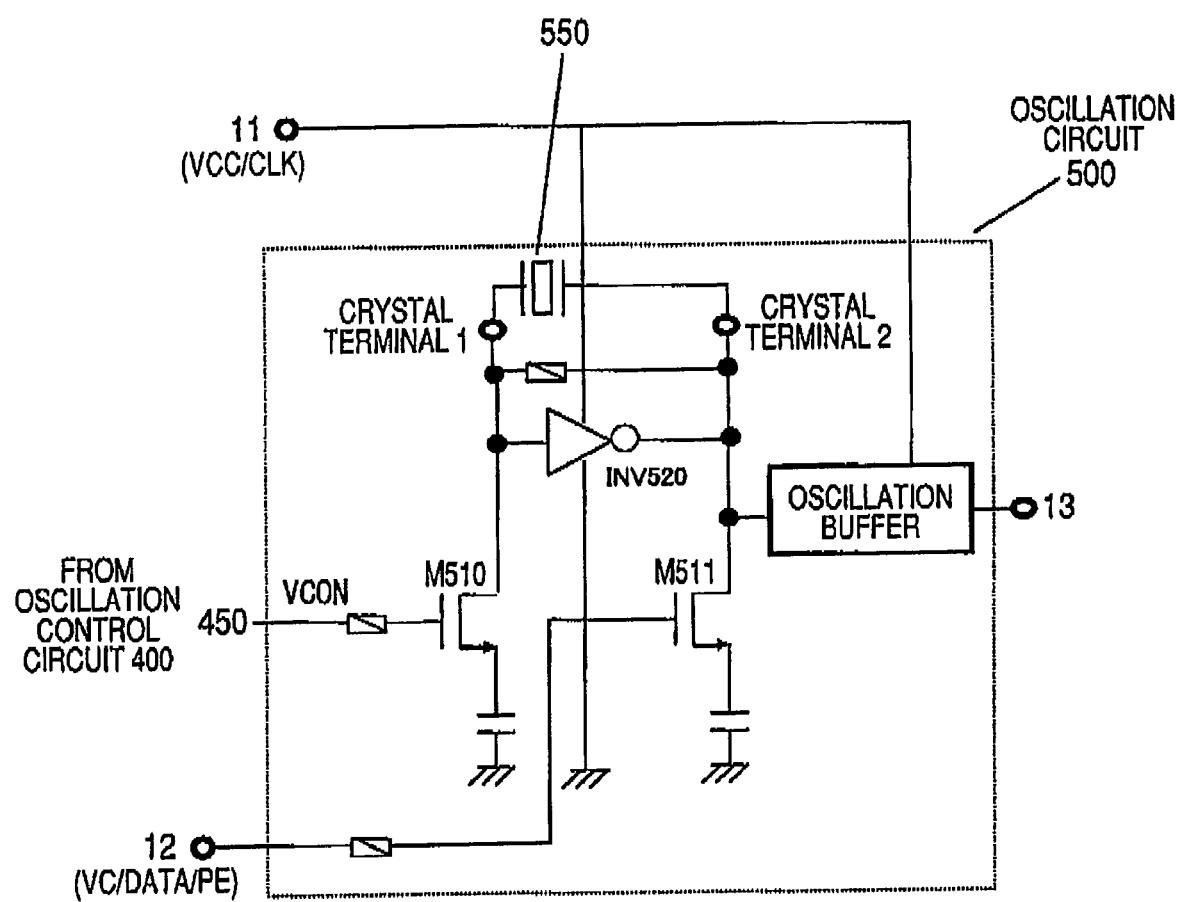
FIG. 6 is a block diagram of an oscillation circuit according to the first embodiment of the present invention.

FIG. 6 is a block diagram of the oscillation circuit 500. An oscillation output highly stable for temperature is obtained by applying a temperature compensated voltage VCON 450 from the oscillation circuit 400 to a gate of a transistor M510. In addition, a VC voltage is applied from the input terminal (VC/DATA/PE) 12 to a gate of a transistor M511 for use as a VCO function.

A crystal vibrator 500 is connected between a crystal terminal 1 and a crystal terminal 2. INV520 designates an inverter whose output is buffered and outputted to an OUTPUT terminal 13.

FIG. 7 shows input waveforms in the power terminal and the input terminal in this embodiment. Specifically, FIG. 7A shows a power/clock signal (VCC/CLK) supplied to the power terminal 11 and FIG. 7C shows an input signal VC/DATA/PE supplied to the input terminal 12.

This represents a case when input signal (VC/DATA/PE) data are set to [H, L, L] in a mode setting interval subsequent to the read mode if the mode selector circuit 100 is configured with 3 bits (F/F circuit 110 to 112: see FIG. 2). In addition, the input signal (VC/DATA/PE) is read at a falling edge of the power/clock signal (VCC/CLK).

When this pattern [H, L, L] is inputted to the input signal (VC/DATA/PE) data, as shown in FIG. 7B, PROM power VCC2 is raised, thereby making it possible to switch to the emulation mode (EM). That is, after switching to the emulation mode (EM), an adjustment bit of the PROM circuit 300 is set by the input signal DATA supplied to the input terminal 12.

Figure 8A:
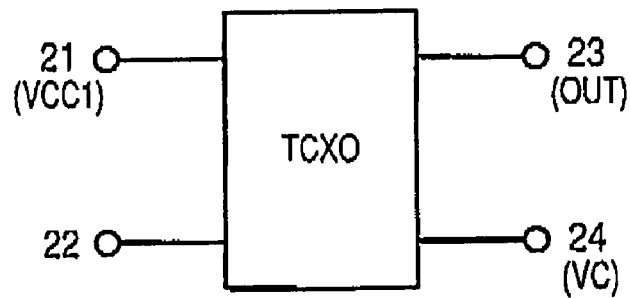
FIG. 8 is a view showing an exemplary terminal configuration of a TCXO module and a TCXO control IC according to the first embodiment of the present invention.

FIG. 8A shows a terminal configuration of a TCXO module according to this embodiment. In this embodiment, the TCXO module has a power terminal (VCC1) 21, a ground terminal (GND) 22, a frequency output terminal (OUT) 23 and an input terminal (VC) 24 (in the presence of a frequency control function).

Figure 8B:
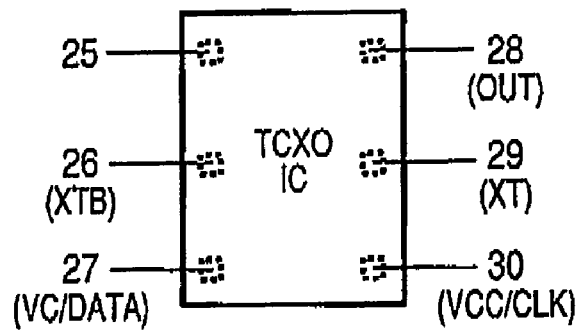

FIG. 8B shows a terminal configuration of a TCXO control IC according to this embodiment. In this embodiment, the TCXO control IC may include 6 terminals: a ground terminal (GND) 25, an output terminal (OUT) 28, a crystal terminal (1XT) 29, a crystal terminal (2XTB) 26, an input terminal (VC/DATA) 27 and a power terminal (VCC/CLK) 30.

Figure 8C:
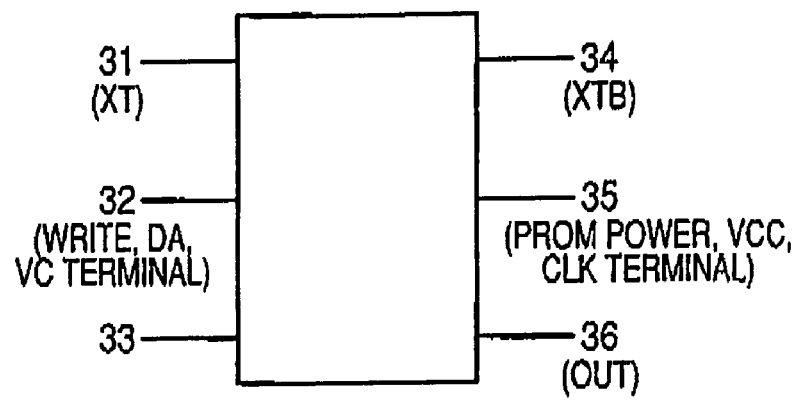

FIG. 8C shows another terminal configuration of the TCXO control IC according to this embodiment. In this embodiment, the TCXO control IC may include 6 terminals: a crystal terminal (1XT) 31, a crystal terminal (2XTB) 34, an input terminal (write, DA, Vc) 32, a power terminal (PROM power, Vcc, CLK) 35, a ground terminal (GND) 33 and an output terminal (OUT) 36.

As described above, according to this embodiment, the PAD terminals of the TCXO control IC can be reduced from conventional 8 pads to 6 pads by using terminals in common. This allows reduction the number of pattern wirings connecting the TCXO module to the IC, thereby realizing miniaturization of the TCXO module.

Second Embodiment

Figure 9:
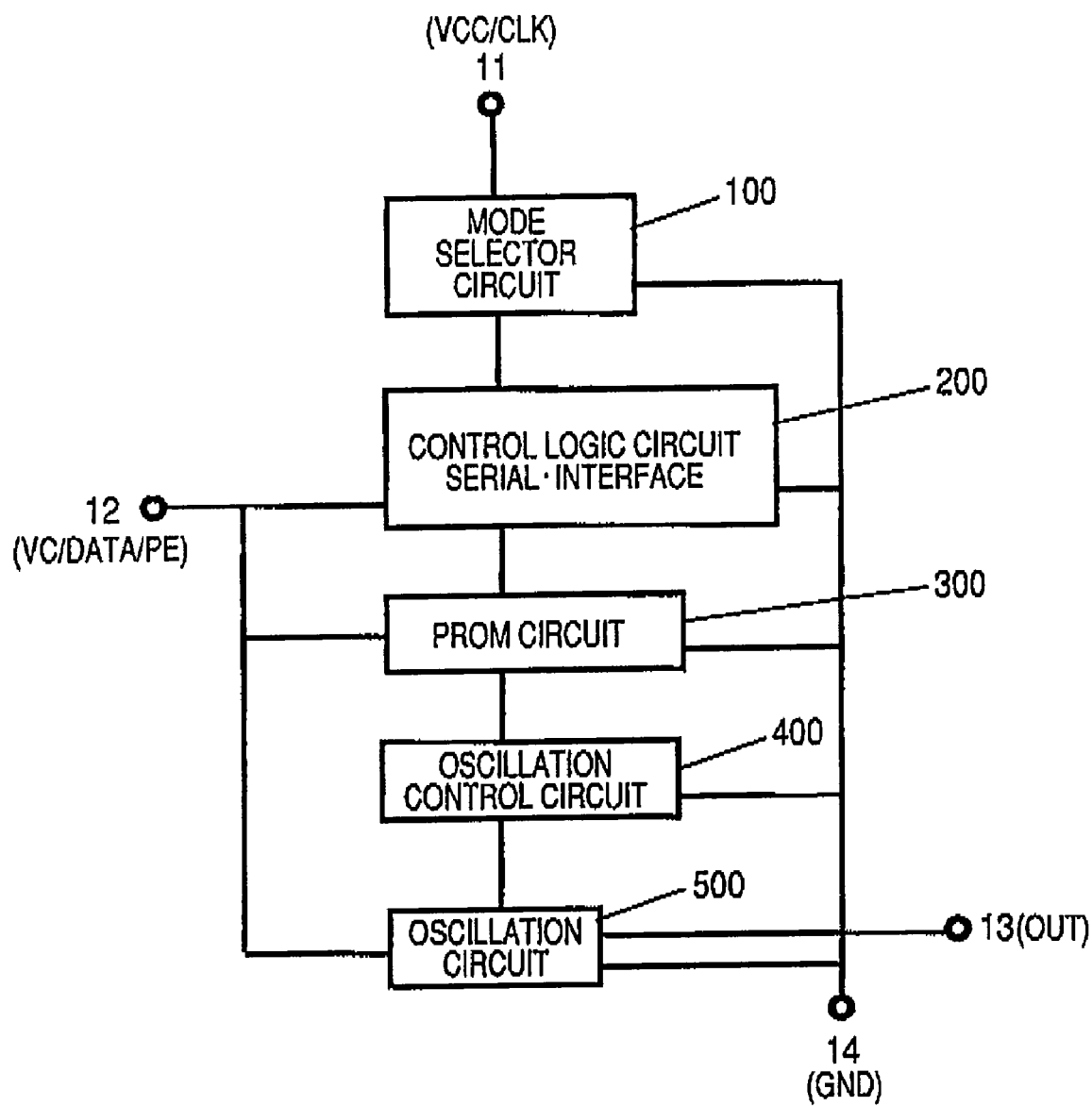
FIG. 9 is a block diagram (2) of an IC for TCXO according to a second embodiment of the present invention.

FIG. 9 shows a configuration of a TCXO control IC according to a second embodiment of the present invention. In this embodiment, the TCXO control IC performs switching of the mode selector circuit 100 only with a CLK pulse applied to the power terminal (VCC/CLK) 11 (Vcc is 3.5 V to 5.5 V). That is, in this embodiment, it is possible to perform a mode setting operation only with a signal of the power terminal (VCC/CLK) 11 without using a signal of the input terminal (VC/DATA/PE) 12 shown in FIG. 2 as a signal for input setting.

Figure 10:
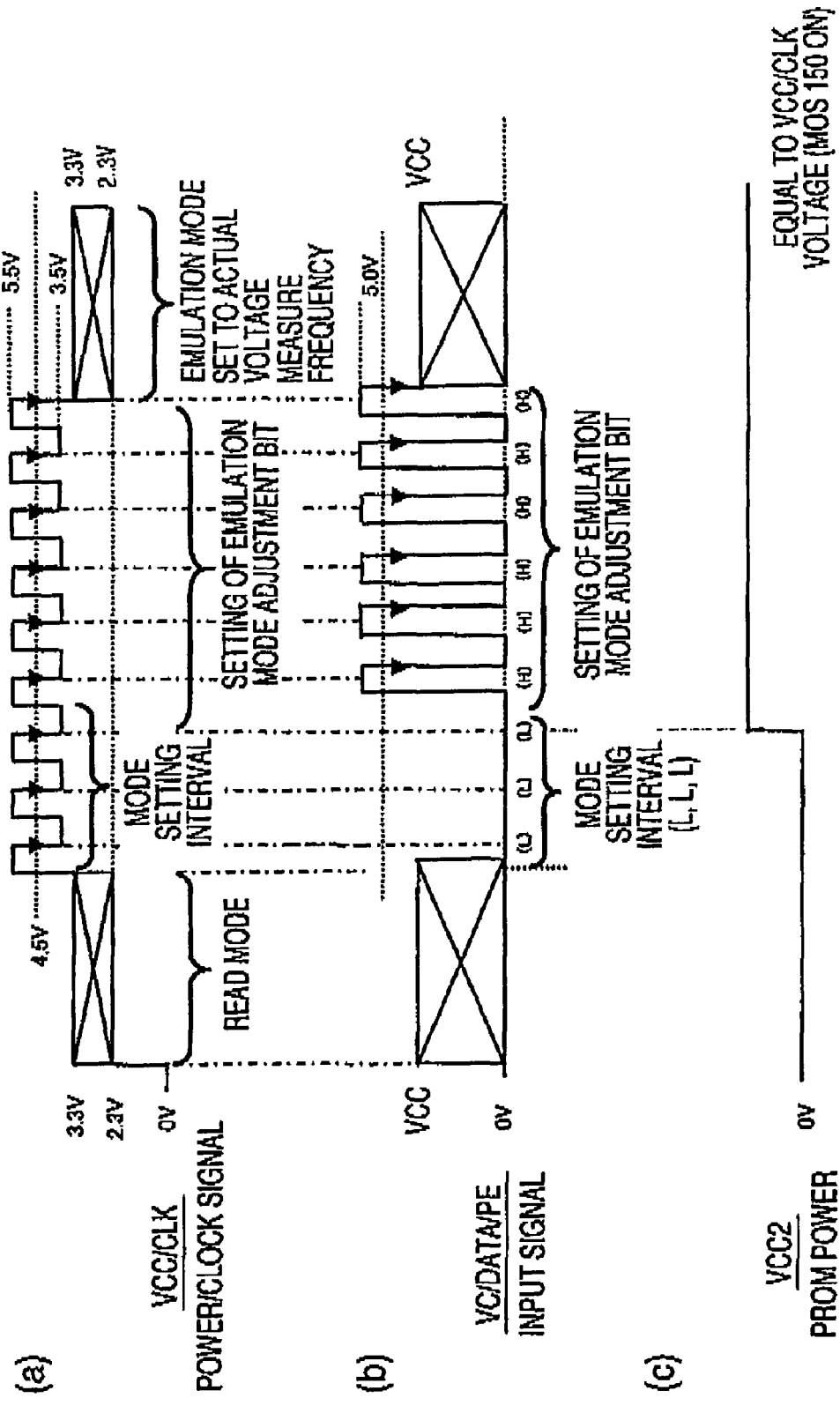
FIG. 10 is a view showing an example of an input waveform according to the second embodiment of the present invention.
Figure 11:
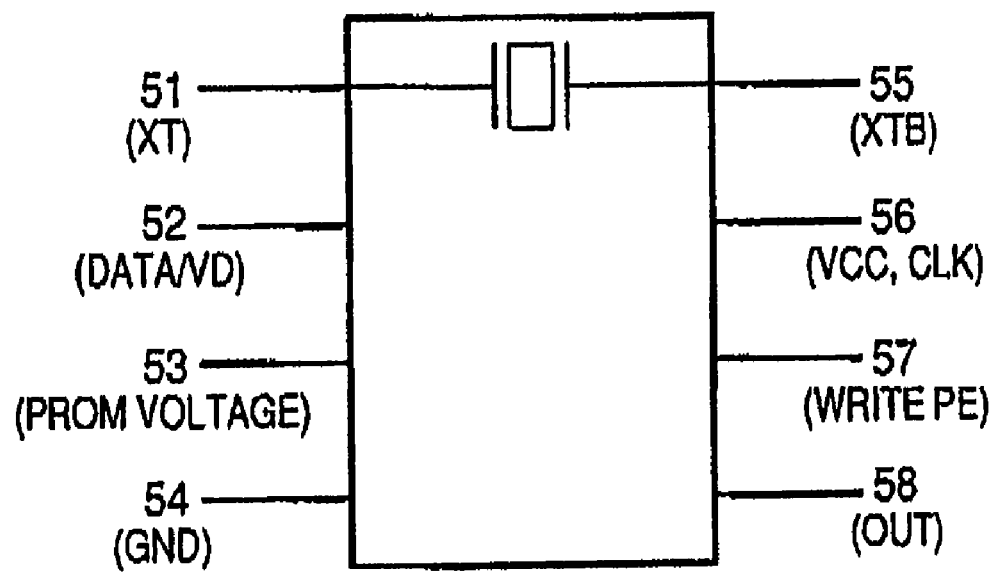
FIG. 11 is a view showing an exemplary configuration of terminals of a conventional IC for TCXO.

FIG. 10 shows input waveforms in the power terminal and the input terminal in this embodiment. Specifically, FIG. 10A shows a waveform of a power/clock signal (VCC/CLK) supplied to the power terminal 11 and FIG. 10B shows a waveform of an input signal VC/DATA/PE supplied to the input terminal 12.

When a signal is inputted to the power terminal 11, as shown in FIG. 10C, PROM power VCC2 is raised, thereby making it possible to switch to the emulation mode (EM). In addition, although an input signal (VC/DATA/PE) [L, L, L] is shown in a mode setting interval, in this embodiment, as shown in FIG. 9, since the input terminal 12 is not connected to the mode selector circuit 100, the input signal (VC/DATA/PE) does not involved in an operation of the mode selector circuit 100. After switching to the emulation mode (EM), an adjustment bit of the PROM circuit 300 is set. In this manner, in this embodiment, it is possible to switch an operation mode to the emulation mode (EM) only with the power/clock signal (VOC/CLK).

As described above, according to the temperature-compensated crystal oscillator related to this embodiment, the PAD terminals of the TCXO control IC can be reduced from conventional 8 pads to 6 pads. This allows reduction the number of pattern wirings connecting the TCXO module to the IC, thereby realizing miniaturization of the TCXO module.

In addition, according to the TCXO module of this embodiment, it is possible to prevent an erroneous operation due to common use of terminals of the mode selector circuit 100, thereby providing a more stable TCXO module.

Third Embodiment

A third embodiment is provided to overcome a conventional problem of common use of an OUT terminal and a CLK terminal on the basis of common use of VCC/CLK and improve productivity.

However, common use of OUT/CLK may be also possible. Details of the conventional problem of OUT/CLK common use are as follows. In a configuration where a mode is selected with a voltage of VCC and CLK is inputted from the OUT terminal, a manufacturing process becomes complicate since there is a need to control both of the VCC terminal and the OUT/CLK terminal. To overcome this problem, it is possible to use the OUT/CLK terminal in common without providing the mode select function to the VCC terminal. That is, it is possible to realize common use of the OUT/CLK terminal without using a level of VCC.

Figure 15:
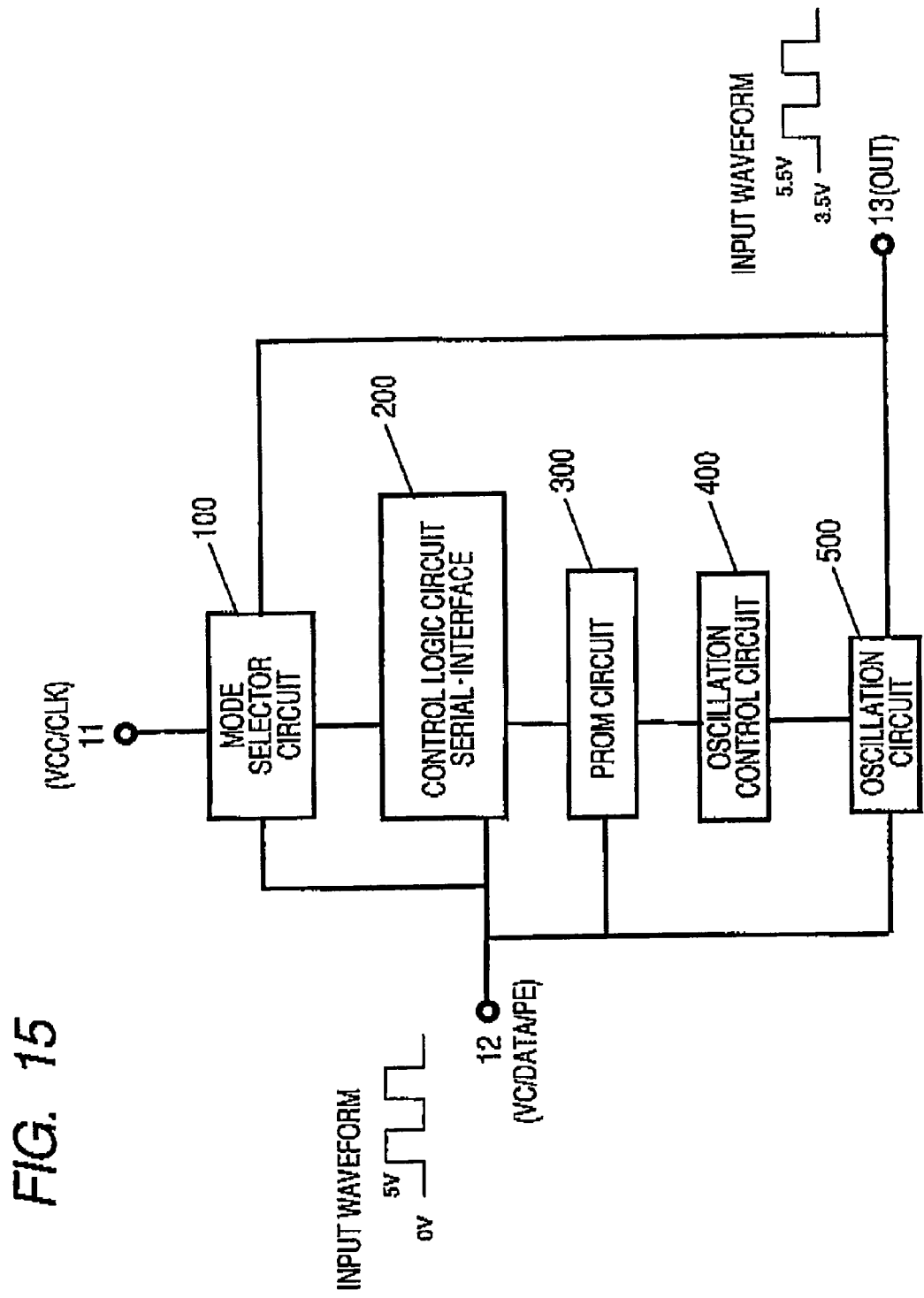
FIG. 15 is a block diagram (4) of an IC for TCXO according to a third embodiment of the present invention.
Figure 16:
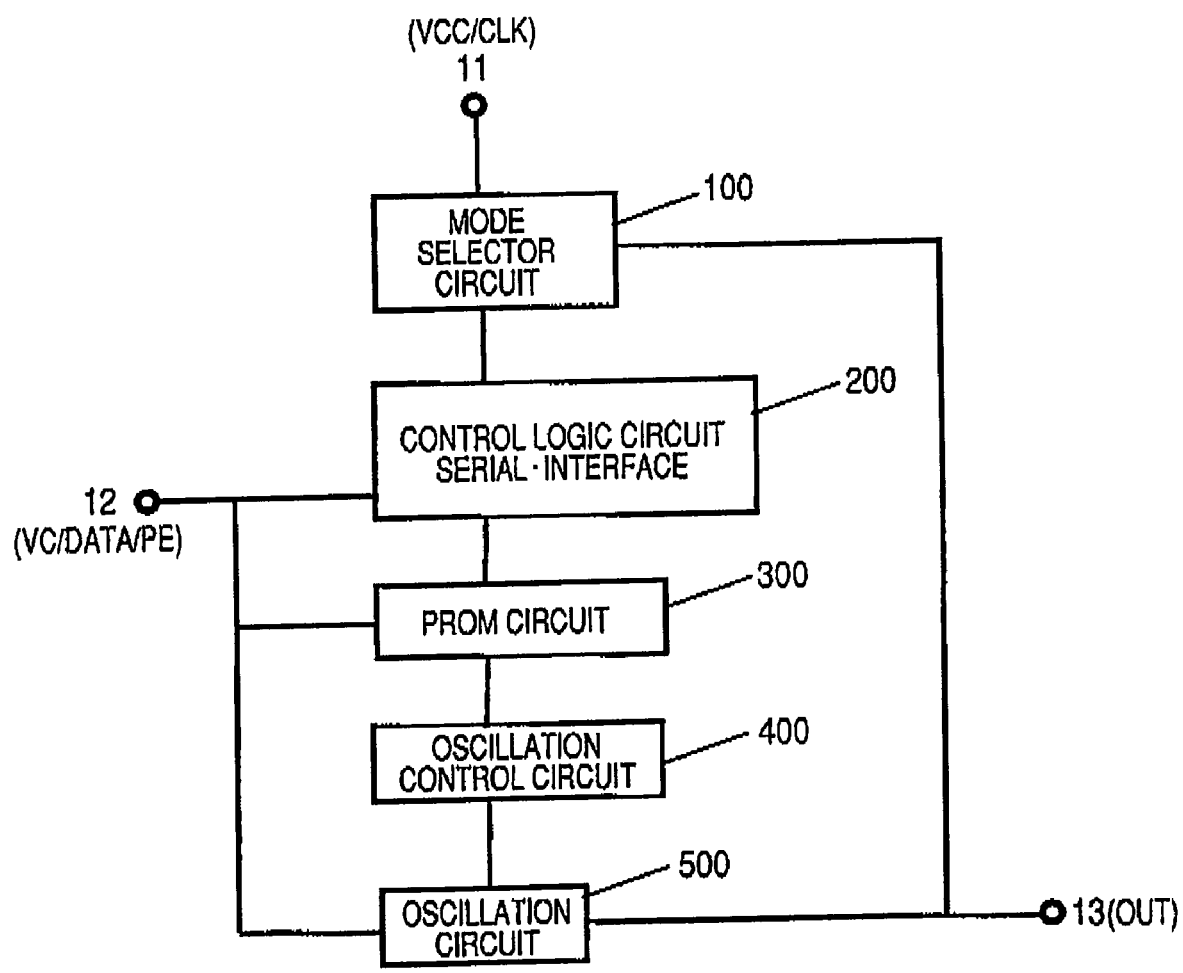
FIG. 16 is a block diagram (5) of an IC for TCXO according to the third embodiment of the present invention.

FIGS. 15 and 16 show block diagrams of a TCXO control IC according to this embodiment. Although CLK is inputted from the output terminal (OUT) 13 after the emulation mode (EM) is set with VCC=3.5 V in the prior art, CLK is inputted from the output terminal (OUT) 13 to set the emulation mode (EM) with VCC unchanged in this embodiment. In addition, the first embodiment involves inputting CLK from the VCC terminal.

In this manner, it is possible to not only input CLK from the VCC terminal 11 but also input CLK from the OUT terminal 13. VCC is set to a typical power voltage, e.g., 2.3 to 3.3 V, and a signal is inputted from the OUT terminal 13 to a mode selector. Upon inputting the mode select signal, VCC2 is raised to switch the emulation mode or the write mode. Although a basic operation is similar to when CLK is inputted from the VCC terminal 11, it is possible to perform the same operation from the OUT terminal 13 and the VC terminal 12 with VCC constant.

Figure 17:
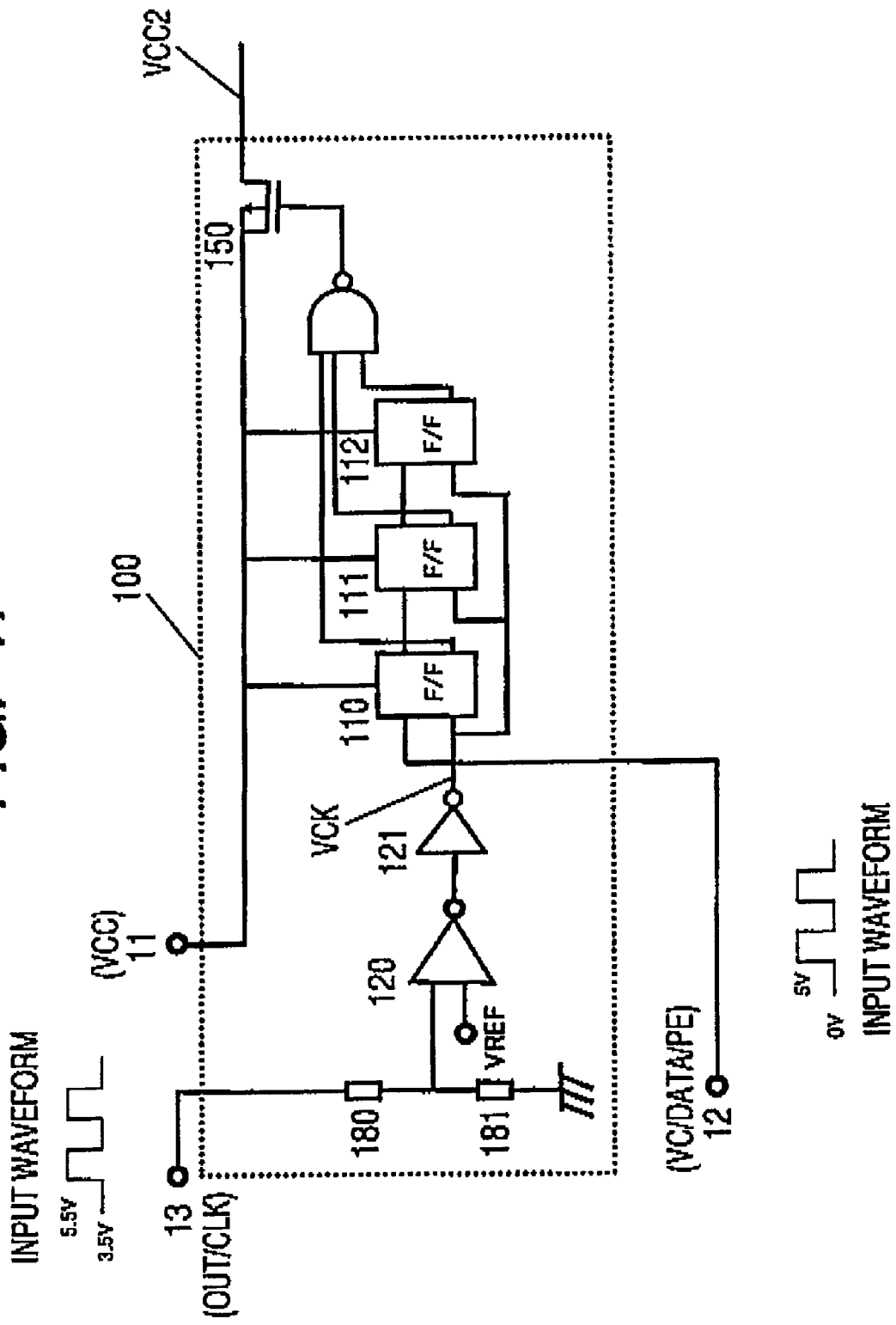
FIG. 17 is a block diagram of a mode selector circuit according to the third embodiment of the present invention.

FIG. 17 is a block diagram of the mode selector circuit 100 according to this embodiment. The mode selector circuit 100 has a comparator 120 with an internal reference voltage VREF of the IC as a reference, and a CLK signal of, for example, 3.5 V to 5.5 V is inputted to the comparator 120 from the output terminal.(OUT/CLK) 13. The input of the comparator 120 is adjusted by dividing the voltage of the CLK signal by means of a resistor 180 and a resistor 181. That is, the comparator 120 outputs, as a pulse signal, a result of comparison between a voltage of a signal inputted from the output terminal (OUT/CLK) 13 (a CLK signal voltage divided by means of the resistor 180 and the resistor 181) and the internal reference voltage VREF of the IC. Accordingly, a signal of 0 V to VCC can be obtained as an input VCK of the F/F circuit 110.

Figure 18:
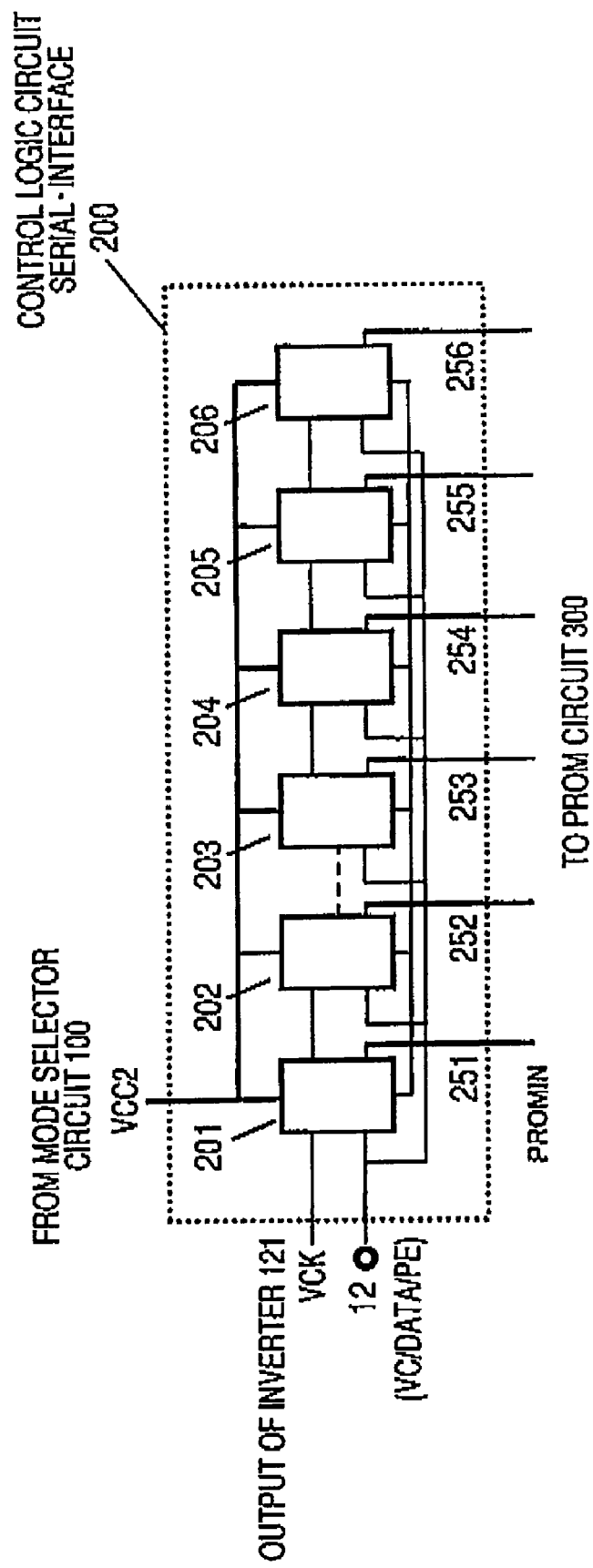
FIG. 18 is a block diagram of a control logic unit according to the third embodiment of the present invention.

FIG. 18 is a block diagram of the control logic circuit serial•interface 200 according to this embodiment. When the power voltage VCC2 is raised in the mode selector circuit 100, power is supplied to the control logic circuit serial•interface 200, thereby making the emulation mode (EM) operable. A signal VCK is inputted to an input clock of the control logic circuit serial•interface 200 and DATA is inputted from the input terminal (VC/DATA/PE) 12. The inputted DATA include a plurality of PROM bit data to be delivered to the PROM circuit 300.

Figure 19:
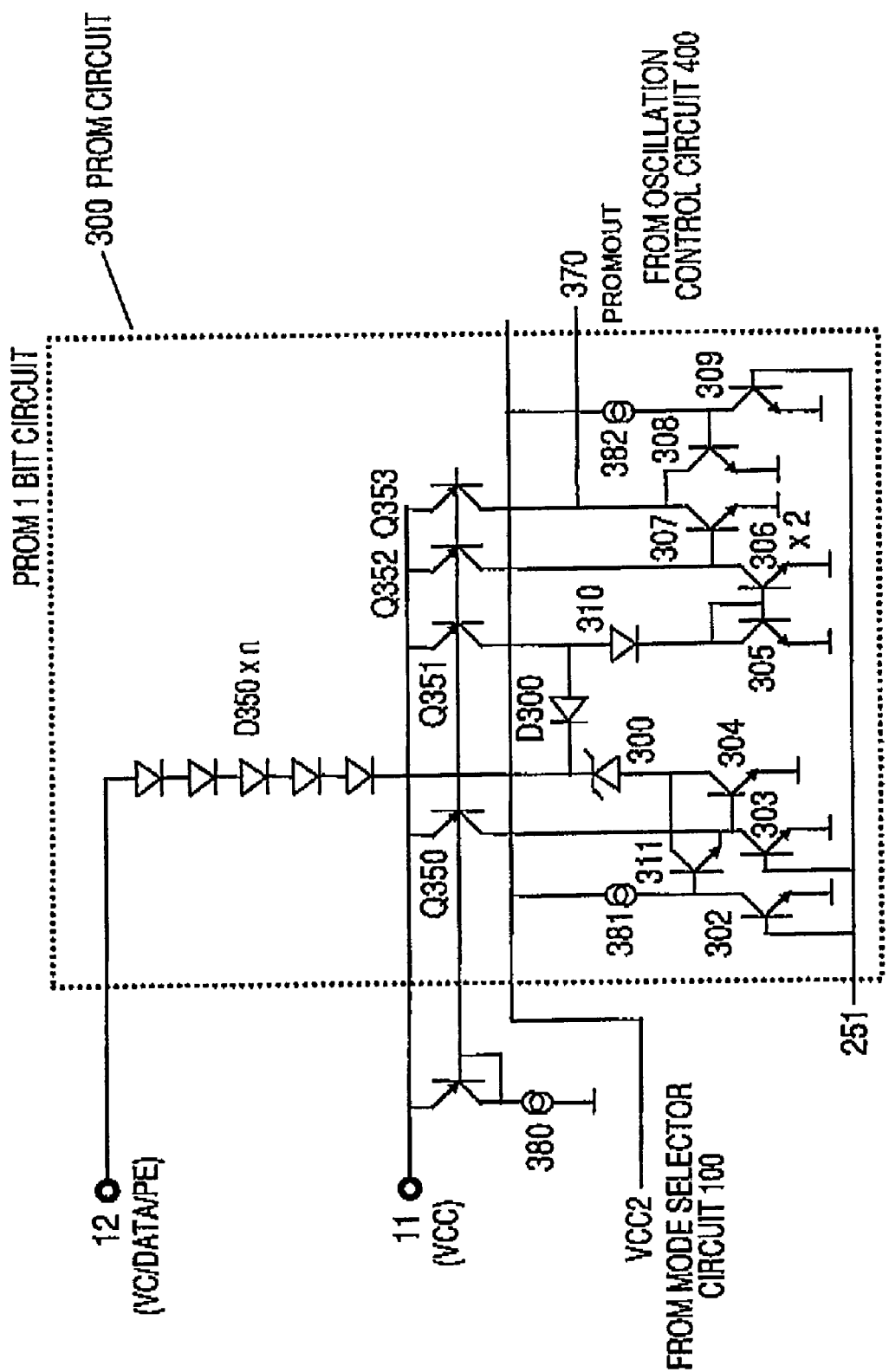
FIG. 19 is a block diagram of a PROM circuit according to the third embodiment of the present invention.

FIG. 19 is a block diagram of the PROM (1 bit) circuit 300 according to this embodiment. An output 251 from an F/F circuit 201 of the control logic circuit serial•interface 200 is inputted to the PROM circuit 300. PROMOUT is switched by a signal from the F/F circuit 201 and a signal is inputted to the oscillation control circuit 400 to control a frequency. Here, an adjusted desired frequency is written in the PROM circuit 300 from the input terminal (VC/DATA/PE) 12.

FIG. 20 is a view for explaining a mode (emulation mode to read mode) switching setting method according to this embodiment, FIG. 20A showing an input waveform of the OUT/CLK terminal 13, FIG. 20B showing a voltage waveform of the power terminal 11, FIG. 20C showing a voltage waveform of the power voltage VCC2 supplied from the mode selector circuit 100, FIG. 20D showing an input waveform of the input terminal (VC/DATA/PE) 12 (in case of FIG. 15), and FIG. 20E showing an input waveform of the input terminal (VC/DATA/PE) 12 (in case of FIG. 16).

The OUT terminal 13 outputs SIN of 0 V to 1 V (signal having a waveform with a voltage peak clipped) in a normal read mode. This embodiment shows an input/output waveform when CLK is inputted from the OUT terminal 13. A CLK waveform is inputted with 3.5 V to 6.5 V from an external power source to set a mode. Thereafter, it is possible to measure a frequency in the emulation mode except for the input waveform.

Figure 21:
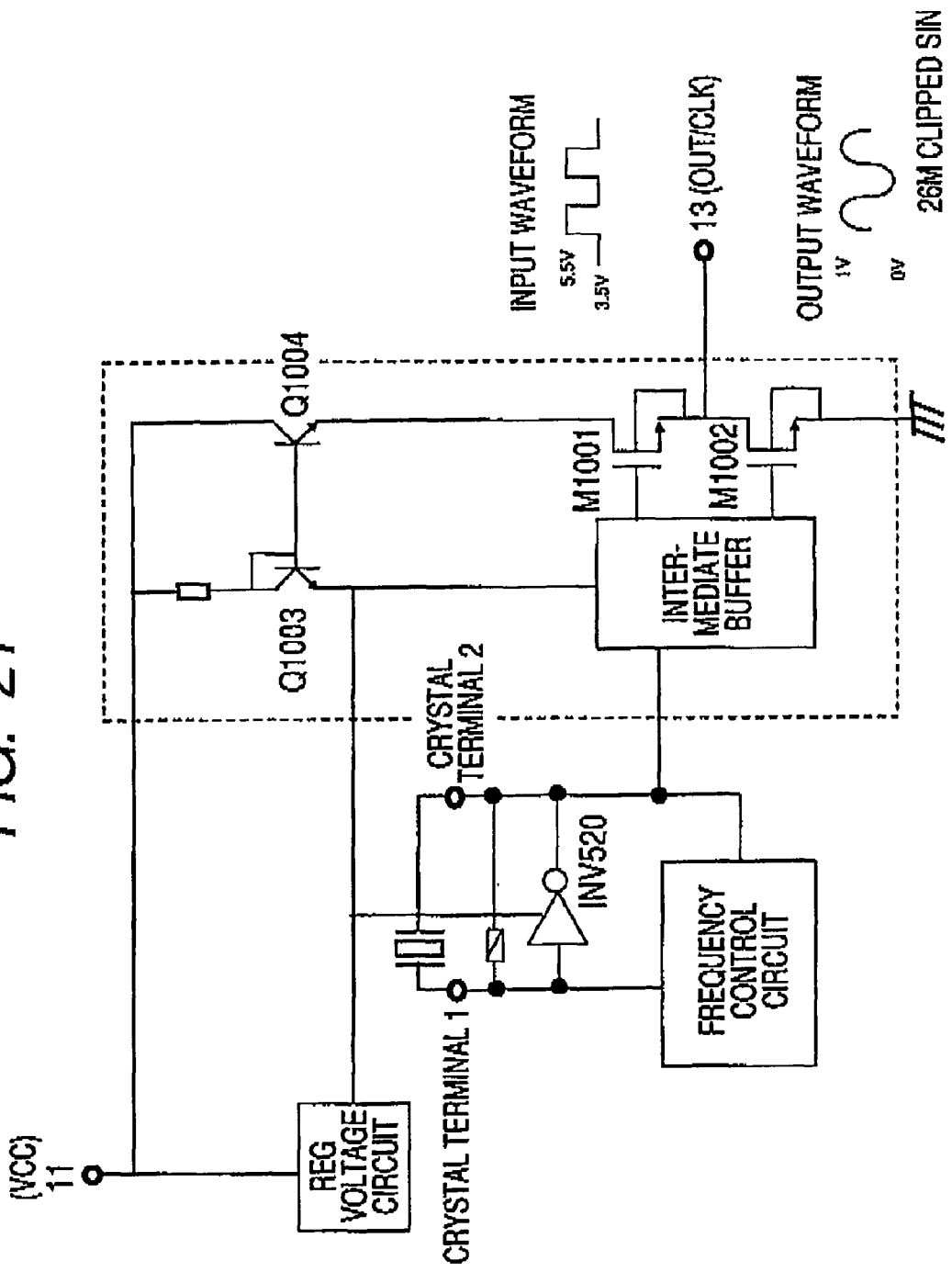
FIG. 21 is a view showing a general output format of an OUT terminal 13 according to an embodiment of the present invention.
Figure 22:
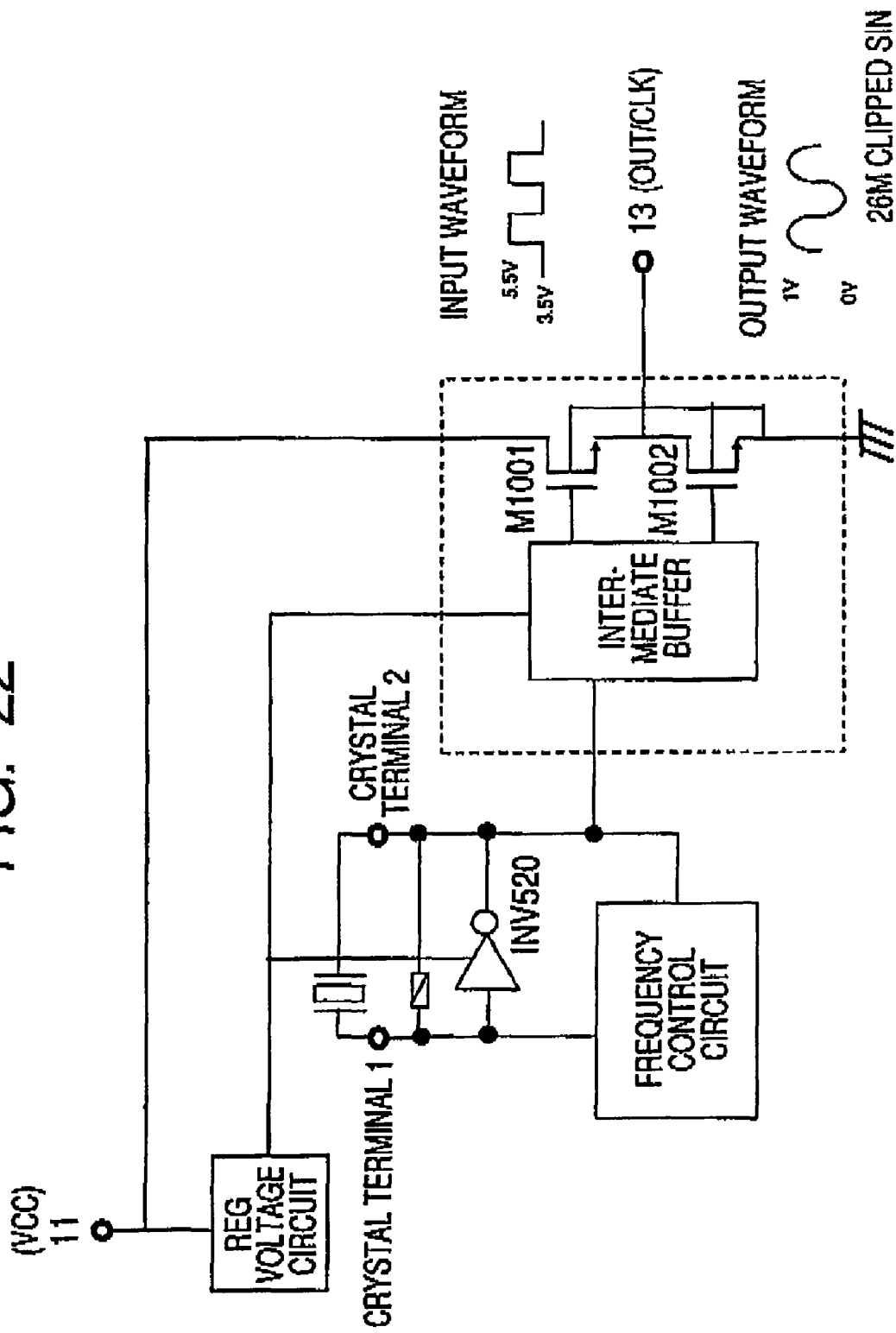
FIG. 22 is a view showing a general output format of an OUT terminal 13 according to an embodiment of the present invention.
Figure 23:
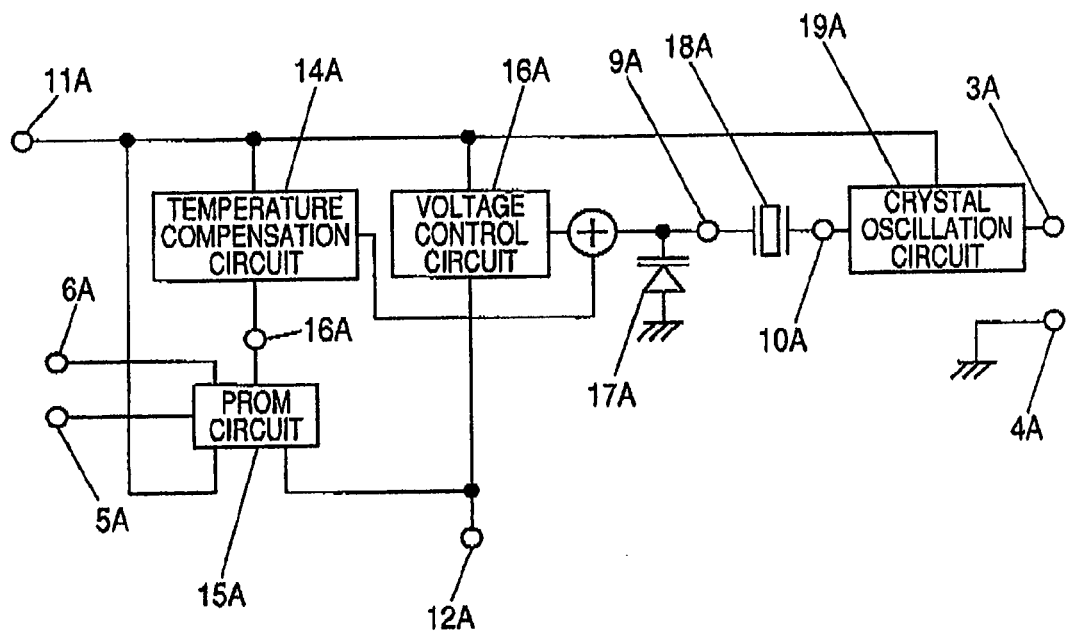
FIG. 23 is a schematic view showing a configuration of a conventional temperature-compensated crystal oscillator.
Figure 24:
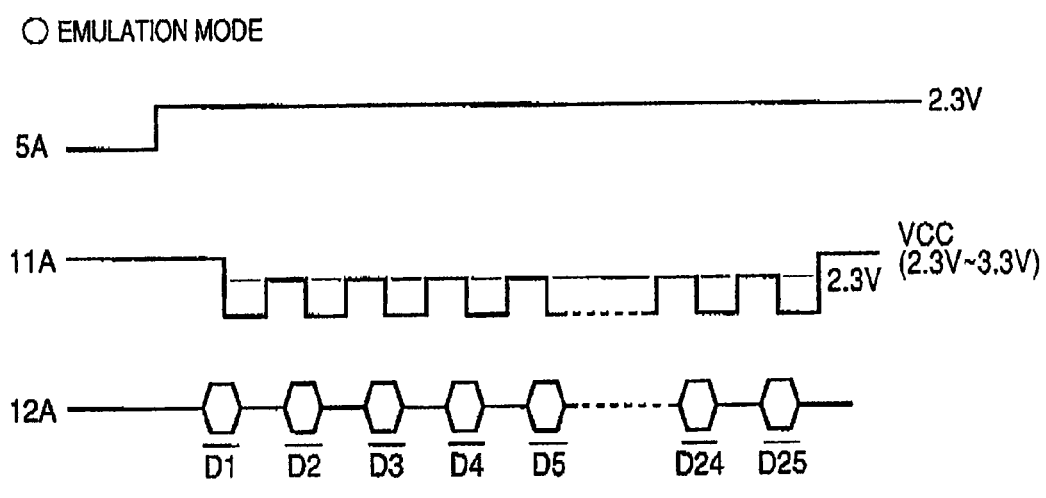
FIG. 24 is a view showing an adjustment data input waveform in a conventional temperature-compensated crystal oscillator.

FIGS. 21 and 22 show a general output format of the OUT terminal 13 according to this embodiment. The general output format of the OUT terminal 13 is composed of NMOS outputs (M1001 and M1002). For example, when a back gate of M1001 is connected to its source and the output terminal 13, if the OUT terminal 13 is set to High, it is difficult to provide a parasitic diode at a back gate-drain terminal with a voltage higher than VCC.

Thus, in FIG. 21, it is possible to set the OUT terminal 13 to High (5.5 V) by buffering with a bipolar transistor at a drain side of M1001. This can prevent current from flowing into the parasitic diode at the back gate-drain terminal with an emitter-base voltage of Q1004 when an application voltage of the OUT terminal 13 is raised.

In addition, in FIG. 22, by setting the back gate to GND, it is possible to raise a voltage of the OUT terminal 13 up to 5.5 V without producing the parasitic diode at the back gate-drain terminal when the application voltage of the OUT terminal 13 is raised.

Fourth Embodiment

Figure 25:
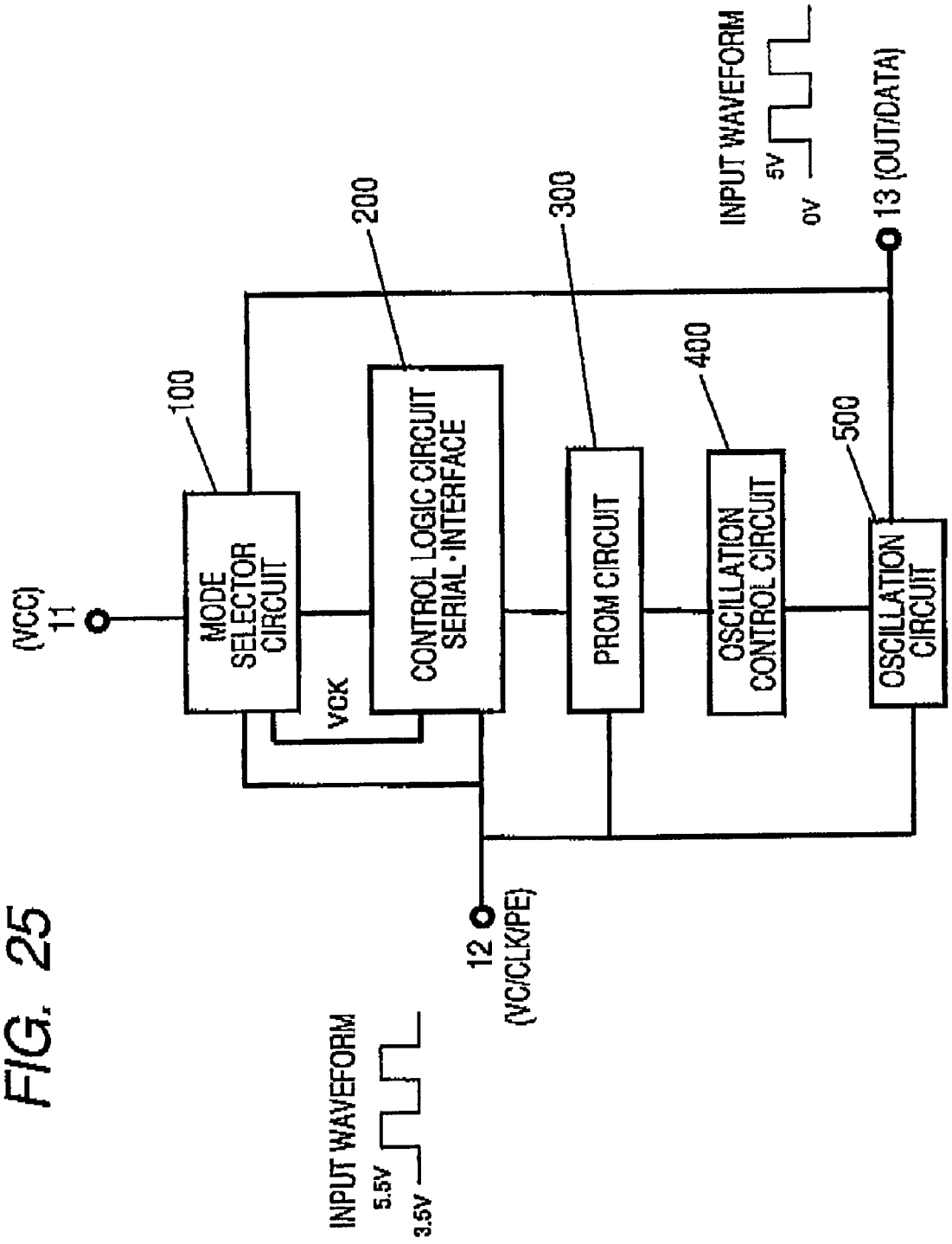
FIG. 25 is a block diagram (6) of an IC for TCXO according to a fourth embodiment of the present invention.
Figure 26:
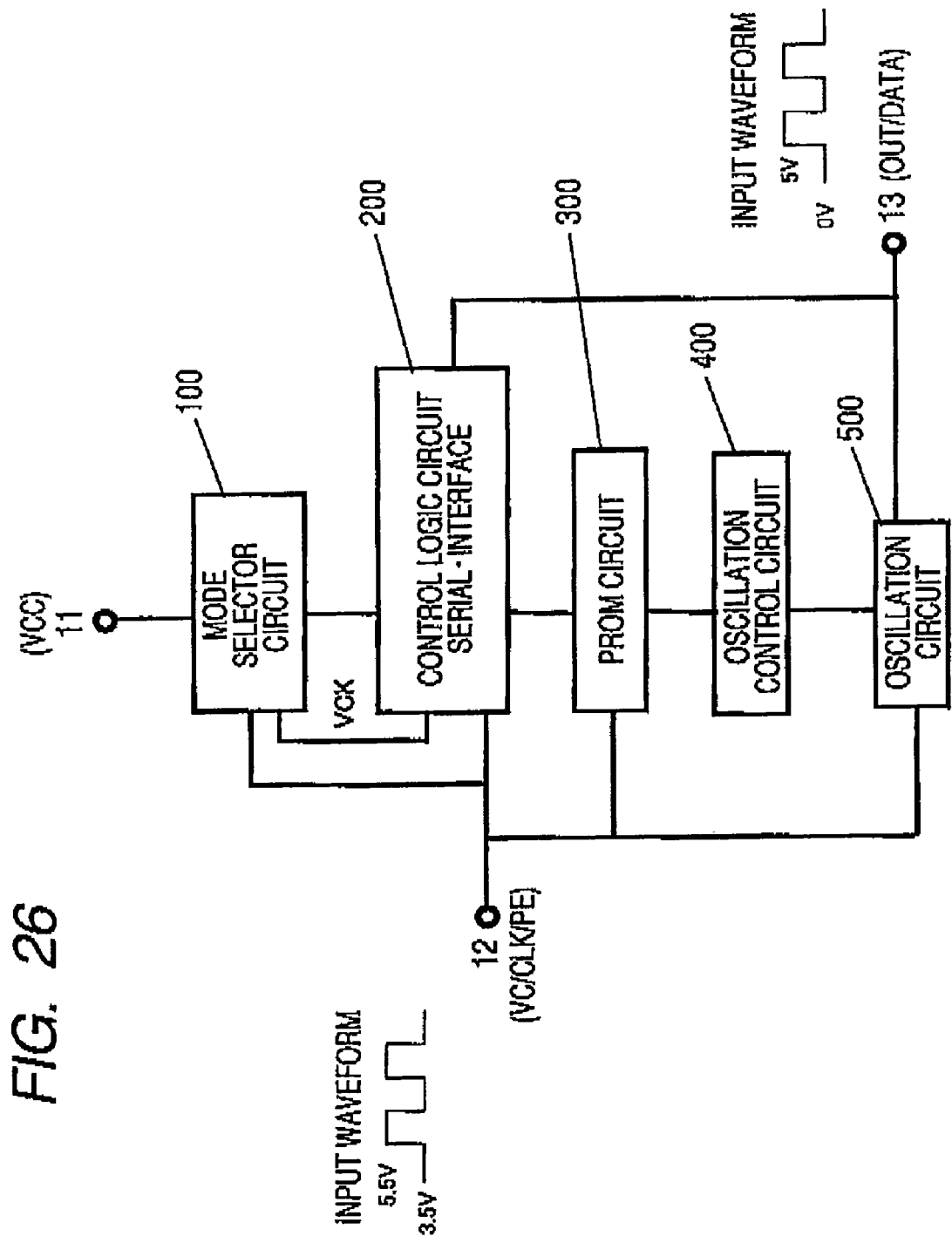
FIG. 26 is a block diagram (7) of an IC for TCXO according to the fourth embodiment of the present invention.

FIGS. 25 and 26 show block diagrams of a TCXO control IC according to a fourth embodiment of the present invention. While CLK is inputted from the VCC terminal in the first embodiment, CLK is inputted from the input terminal (VC) 12 to set the emulation mode (EM) in the fourth embodiment.

In this manner, it is possible to not only input CLK from the VCC terminal 11 but also input CLK from the VC terminal 12. VCC is set to a typical power voltage, e.g., 2.3 to 3.3 V, and a signal is inputted from the VC terminal 12 to a mode selector. Upon inputting the mode select signal, VCC2 is raised to switch the emulation mode or the write mode.

Although a basic operation is similar to when CLK is inputted from the VCC terminal 11, it is possible to perform the same operation from the OUT terminal 13 and the VC terminal 12 with VCC constant.

Figure 27:
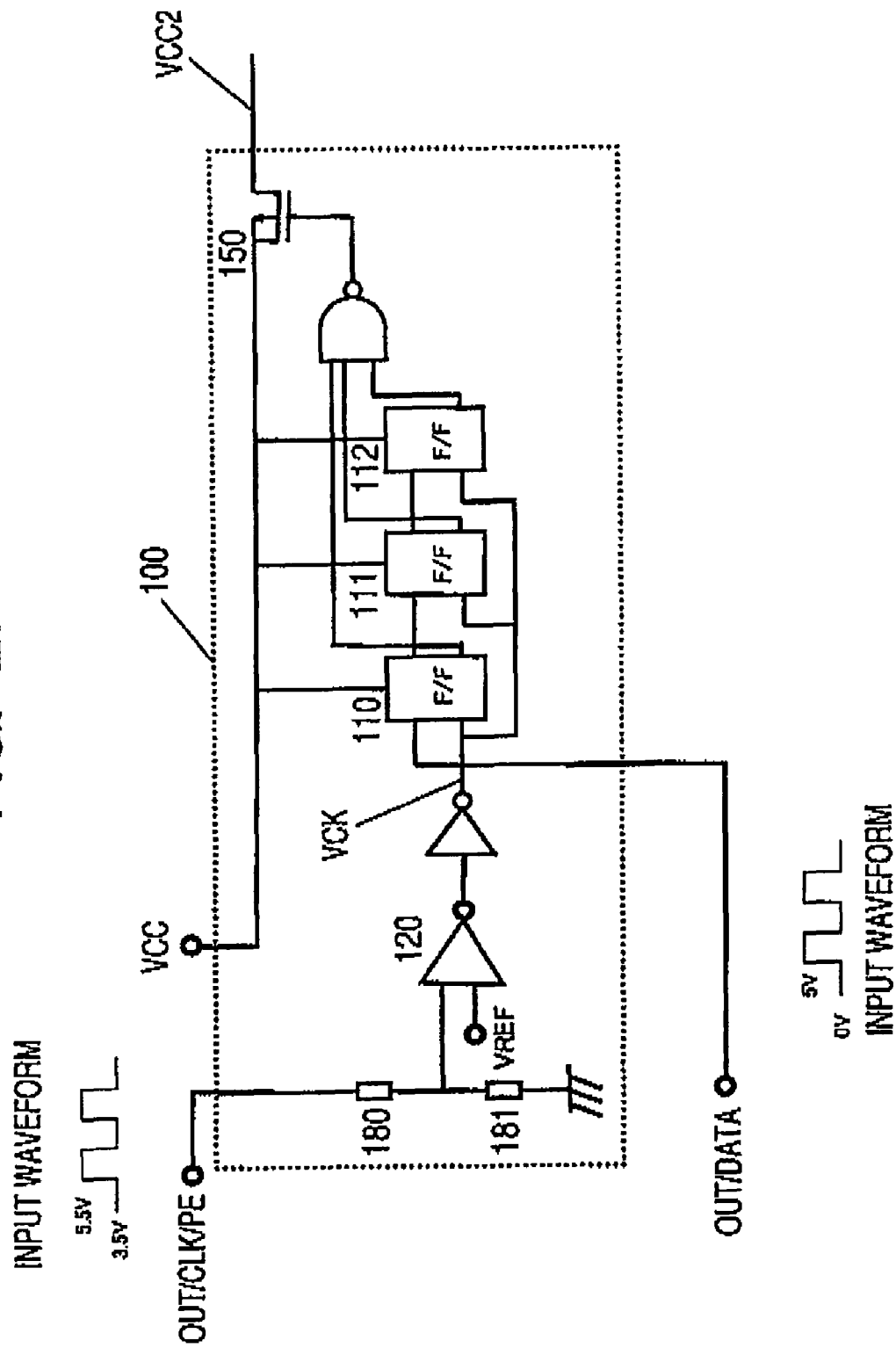
FIG. 27 is a block diagram of a mode selector circuit according to the fourth embodiment of the present invention.

FIG. 27 is a block diagram of the mode selector circuit 100 according to this embodiment. The mode selector circuit 100 has a comparator 120 with an internal reference voltage VREF of the IC as a reference, and a CLK signal of, for example, 3.5 V to 5.5 V is inputted to the comparator 120 from the input terminal (VC/CLK) 12. The input of the comparator 120 is adjusted by dividing the voltage of the CLK signal by means of a resistor 180 and a resistor 181.

That is, the comparator 120 outputs, as a pulse signal, a result of comparison between a voltage of a signal inputted from the input terminal (VC/CLK) 12 (a CLK signal voltage divided by means of the resistor 180 and the resistor 181) and the internal reference voltage VREF of the IC.

Accordingly, a signal of 0 V to VCC can be obtained as an input VCK of the F/F circuit 110.

Figure 28:
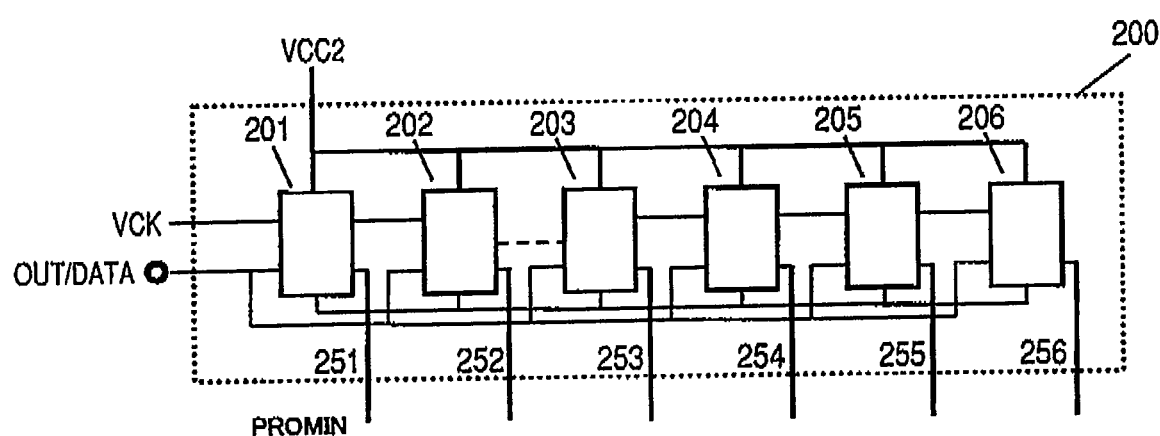
FIG. 28 is a block diagram of a control logic unit according to the fourth embodiment of the present invention.

FIG. 28 is a block diagram of the control logic circuit serial•interface 200 according to this embodiment. When the power voltage VCC2 is raised in the mode selector circuit 100, power is supplied to the control logic circuit serial•interface 200, thereby making the emulation mode (EM) operable. A signal VCK is inputted to an input clock of the control logic circuit serial•interface 200 and DATA is inputted from the output terminal (OUT/DATA) 13. The inputted DATA include a plurality of PROM bit data to be delivered to the PROM circuit 300.

Figure 29:
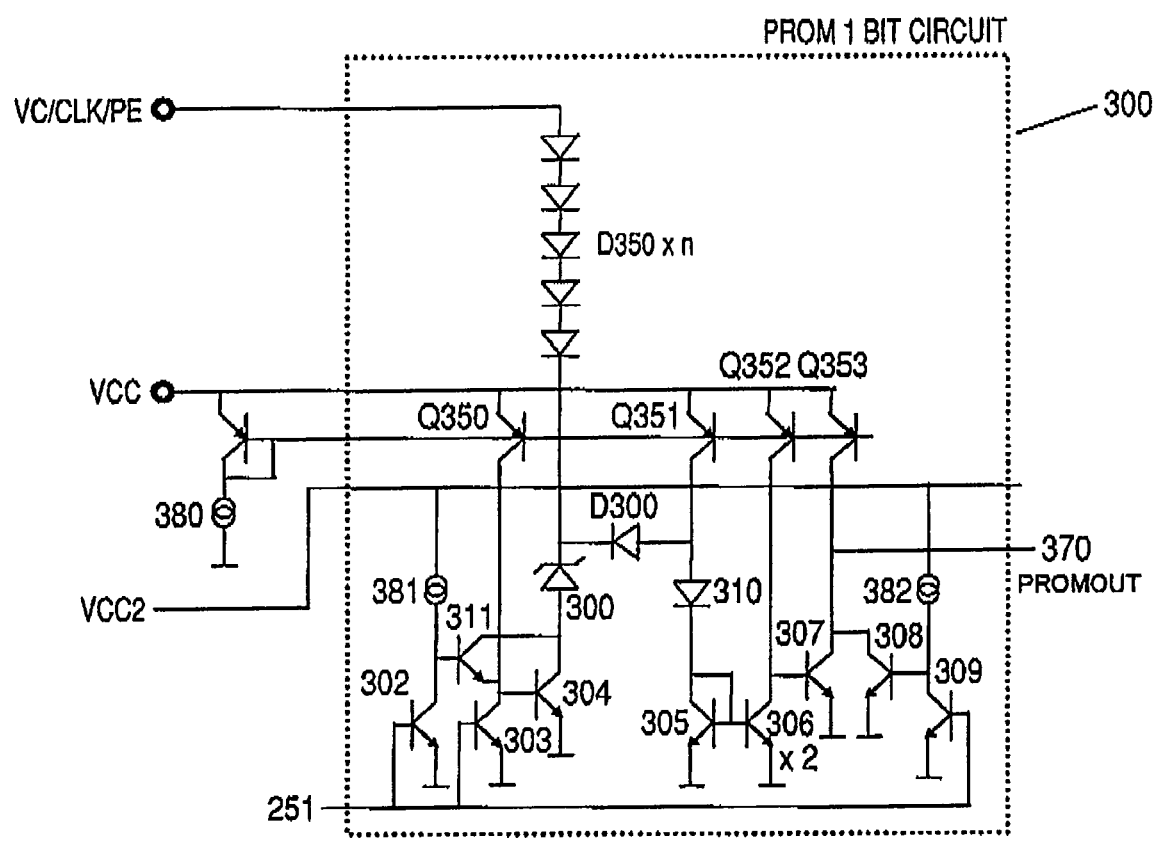
FIG. 29 is a block diagram of a PROM circuit according to the fourth embodiment of the present invention.

FIG. 29 is a block diagram of the PROM (1 bit) circuit 300 according to this embodiment.

An output 251 from an F/F circuit 201 of the control logic circuit serial•interface 200 is inputted to the PROM circuit 300. PROMOUT is switched by a signal from the F/F circuit 201 and a signal is inputted to the oscillation control circuit 400 to control a frequency. Here, an adjusted desired frequency is written in the PROM circuit 300 from the input terminal (VC/CLK/PE) 12.

FIG. 30 is a view for explaining a mode (emulation mode to read mode) switching setting method according to this embodiment, FIG. 30A showing an input waveform of the VC/CLK terminal 13, FIG. 30B showing a voltage waveform of the power terminal 11, FIG. 30C showing a voltage waveform of the power voltage VCC2 supplied from the mode selector circuit 100, FIG. 30D showing an input waveform of the output terminal (OUT/DATA) 13 (in case of FIG. 25), and FIG. 30E showing an input waveform of the output terminal (OUT/DATA) 13 (in case of FIG. 26).

The OUT terminal 13 outputs SIN of 0 V to 1 V (signal having a waveform with a voltage peak clipped) in a normal read mode. This embodiment shows an input/output waveform when DATA is inputted from the OUT terminal 13.

A DATA waveform is inputted with 0 V to 5.5 V from an external power source to set a mode.

Thereafter, it is possible to measure a frequency in the emulation mode except for the input waveform.

In raising a voltage of DATA from the OUT terminal up to 5.5 V, it is possible to input 0 V to 5.5 V simply if it is configured as shown in FIGS. 21 and 22 in the same way as the second embodiment.

Fifth Embodiment

Figure 31:
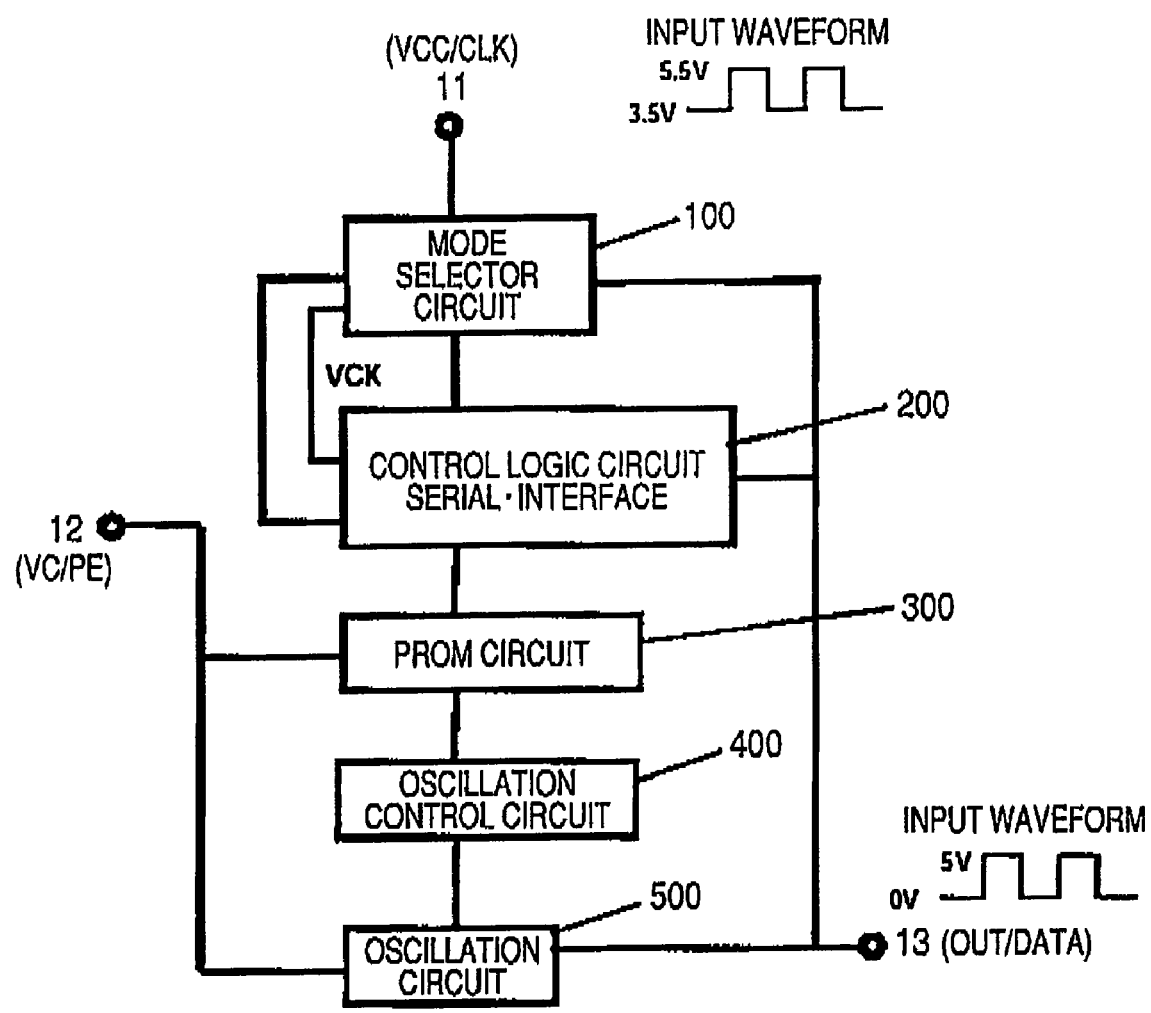
FIG. 31 is a block diagram (8) of an IC for TCXO according to a fifth embodiment of the present invention.
Figure 32:
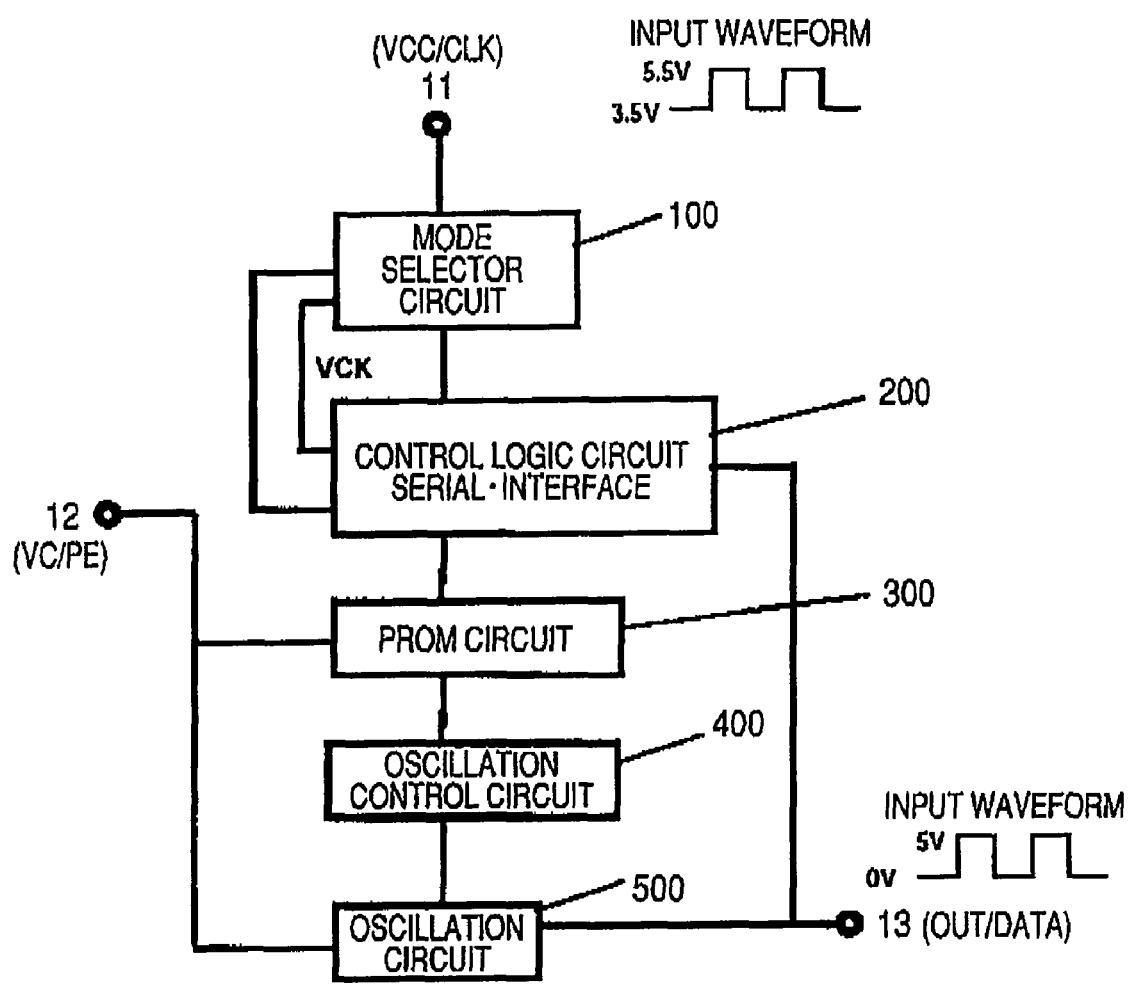
FIG. 32 is a block diagram (9) of an IC for TCXO according to the fifth embodiment of the present invention.

FIGS. 31 and 32 show block diagrams of a TCXO control IC according to a fifth embodiment of the present invention. While CLK is inputted from the VCC terminal and DATA is inputted from the input terminal (VC) 12 in the first embodiment, DATA is inputted from the output terminal to set the emulation mode (EM) in the fifth embodiment.

In this manner, it is possible to input DATA from the output terminal 13. A signal is inputted from the VCC terminal 11 to a mode selector circuit 100. Upon inputting the mode select signal, VCC2 is raised to switch the emulation mode or the write mode.

A basic operation is similar to when CLK is inputted from the VCC terminal 11 and DATA is inputted from the input terminal 12.

Figure 33:
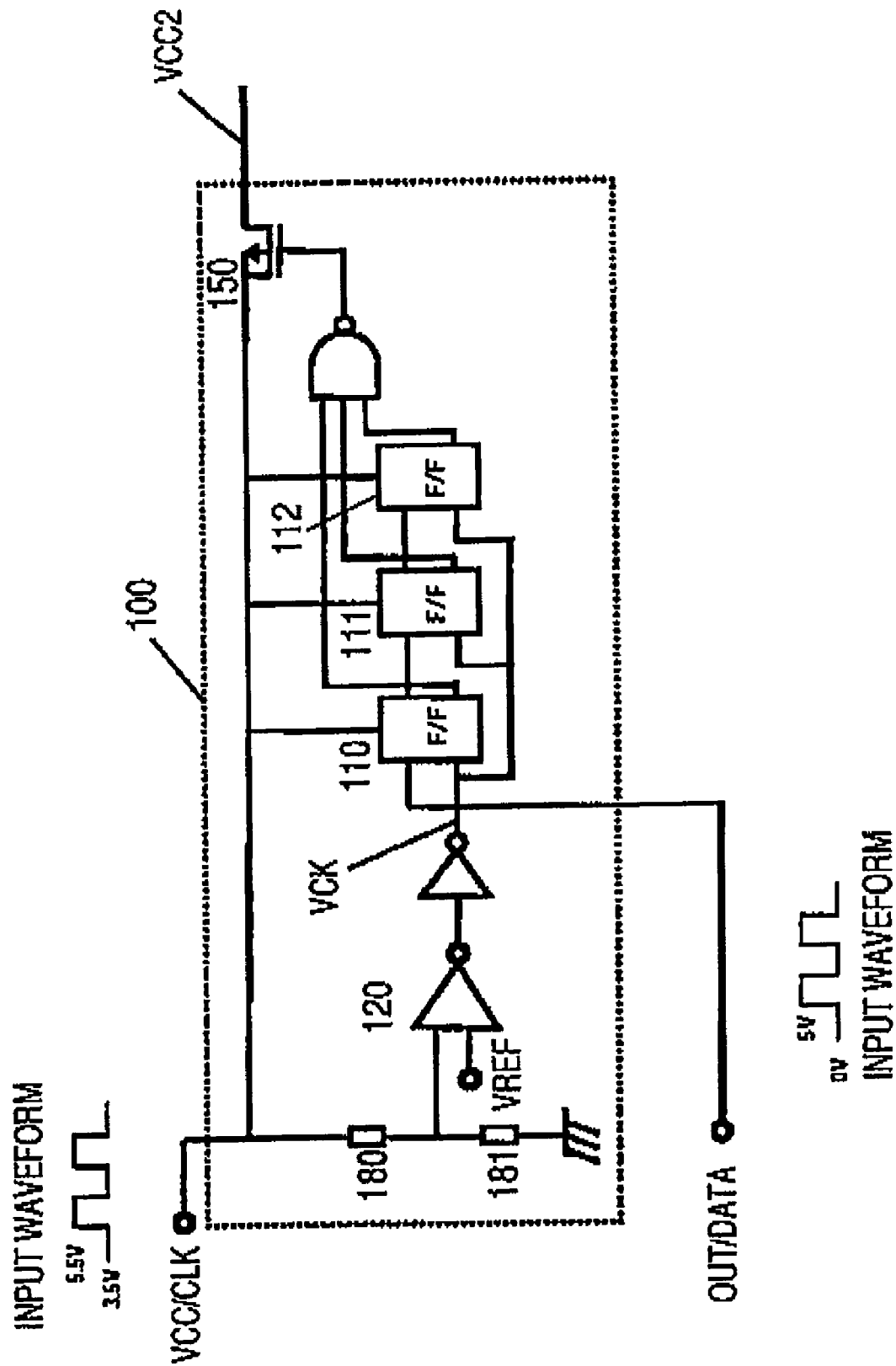
FIG. 33 is a block diagram of a mode selector circuit according to the fifth embodiment of the present invention.

FIG. 33 is a block diagram of the mode selector circuit 100 according to this embodiment. The mode selector circuit 100 has a comparator 120 with an internal reference voltage VREF of the IC as a reference, and a CLK signal of, for example, 3.5 V to 5.5 V is inputted to the comparator 120 from the power terminal (VCC/CLK) 12. The input of the comparator 120 is adjusted by dividing the voltage of the CLK signal by means of a resistor 180 and a resistor 181.

That is, the comparator 120 outputs, as a pulse signal, a result of comparison between a voltage of a signal inputted from the power terminal (VCC/CLK) 12 (a CLK signal voltage divided by means of the resistor 180 and the resistor 181) and the internal reference voltage VREF of the IC.

Accordingly, a signal of 0 V to VCC can be obtained as an input VCK of the F/F circuit 110.

Figure 34:
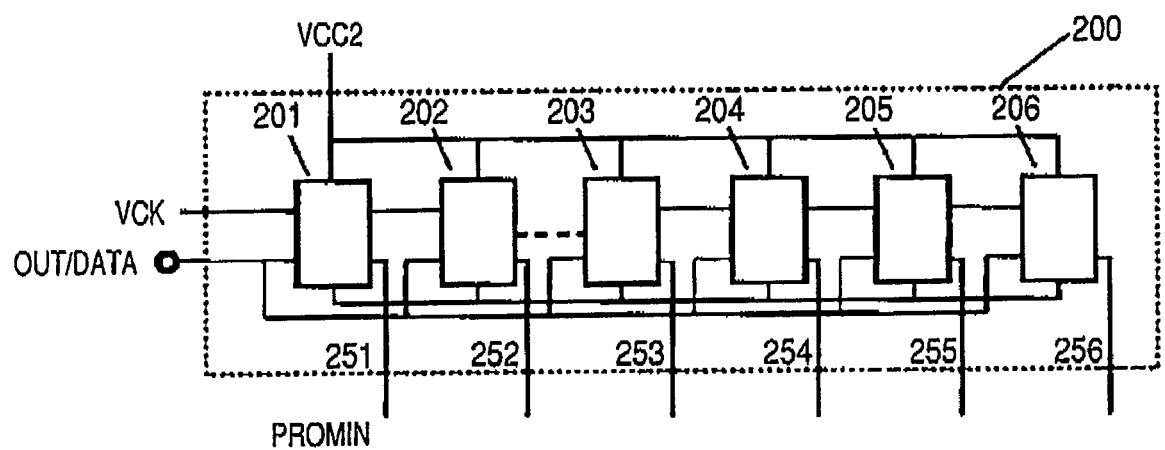
FIG. 34 is a block diagram of a control logic unit according to the fifth embodiment of the present invention.

FIG. 34 is a block diagram of the control logic circuit serial•interface 200 according to this embodiment. When the power voltage VCC2 is raised in the mode selector circuit 100, power is supplied to the control logic circuit serial•interface 200, thereby making the emulation mode (EM) operable. A signal VCK is inputted to an input clock of the control logic circuit serial•interface 200 and DATA is inputted from the output terminal (OUT/DATA) 13. The inputted DATA include a plurality of PROM bit data to be delivered to the PROM circuit 300.

Figure 35:
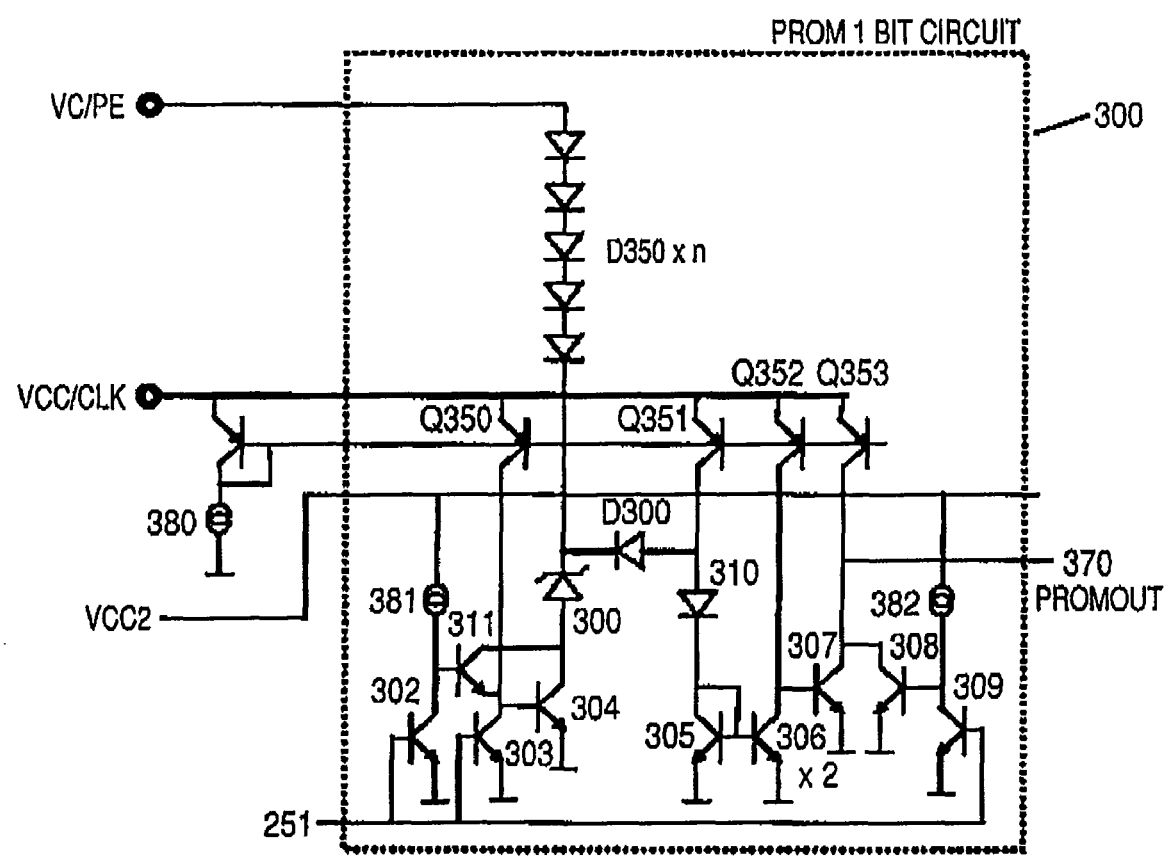
FIG. 35 is a block diagram of a PROM circuit according to the fifth embodiment of the present invention.

FIG. 35 is a block diagram of the PROM (1 bit) circuit 300 according to this embodiment.

An output 251 from an F/F circuit 201 of the control logic circuit serial•interface 200 is inputted to the PROM circuit 300. PROMOUT is switched by a signal from the F/F circuit 201 and a signal is inputted to the oscillation control circuit 400 to control a frequency. Here, an adjusted desired frequency is written in the PROM circuit 300 from the input terminal (VC/PE) 12.

FIG. 36 is a view for explaining a mode (emulation mode to read mode) switching setting method according to this embodiment, FIG. 36A showing an input waveform of the VCC/CLK terminal 11, FIG. 36B showing a voltage waveform of the power voltage VCC2 supplied from the mode selector circuit 100, FIG. 36C showing an input waveform of the output terminal (OUT/DATA) 13 (in case of FIG. 31), and FIG. 36D showing an input waveform of the output terminal (OUT/DATA) 13 (in case of FIG. 32).

The OUT terminal 13 outputs SIN of 0 V to 1 V (signal having a waveform with a voltage peak clipped) in a normal read mode. FIGS. 36C and 36D show an input/output waveform when DATA is inputted from the OUT terminal 13.

A DATA waveform is inputted with 0 V to 5.5 V from an external power source to set a mode.

Thereafter, it is possible to measure a frequency in the emulation mode except for the input waveform.

In raising a voltage of DATA from the OUT terminal up to 5.5 V, it is possible to input 0 V to 5.5 V simply if it is configured as shown in FIGS. 21 and 22 in the same way as the second embodiment.

Seventh Embodiment

Figure 39:
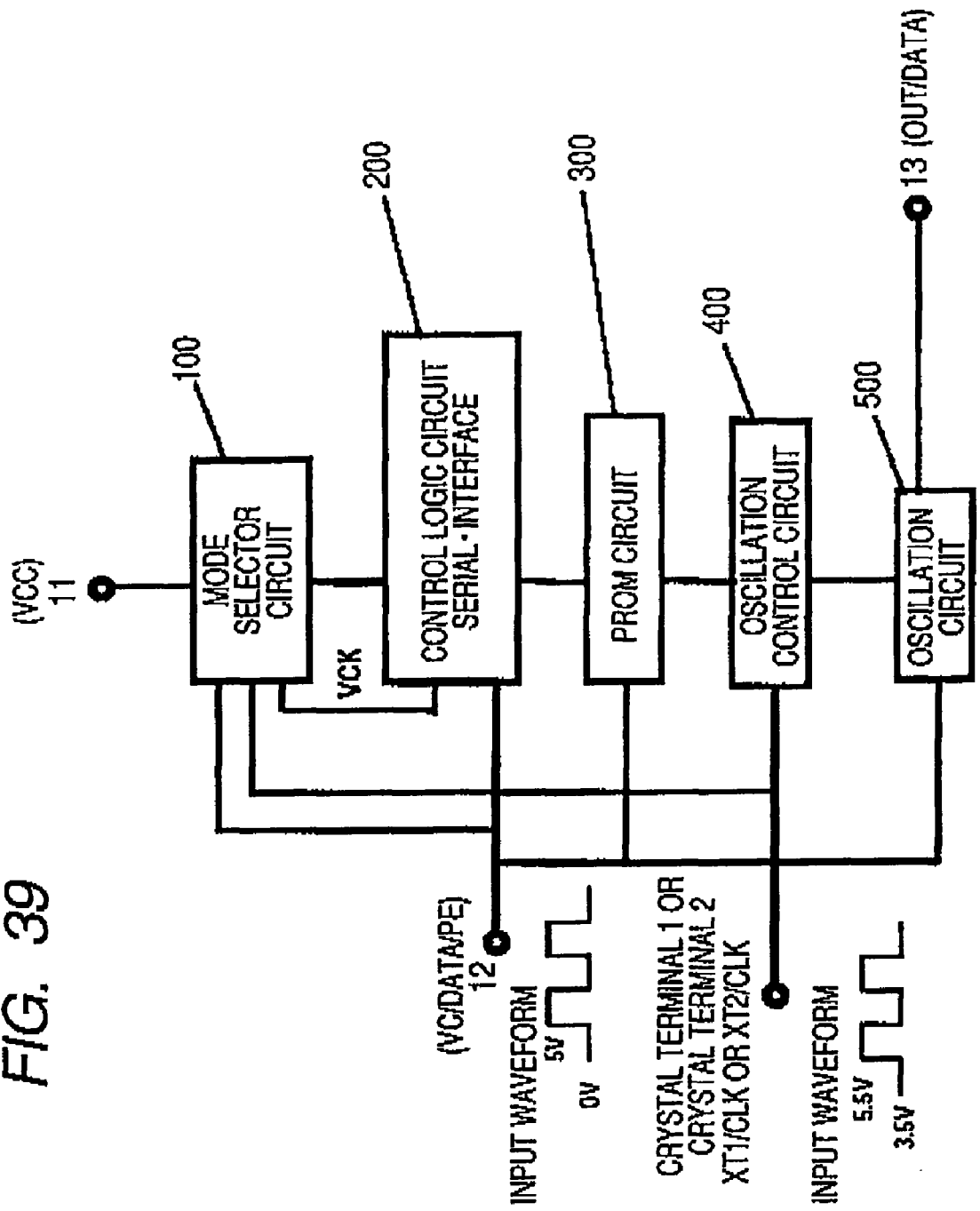
FIG. 39 is a block diagram (10) of an IC for TCXO according to a sixth embodiment of the present invention.
Figure 40:
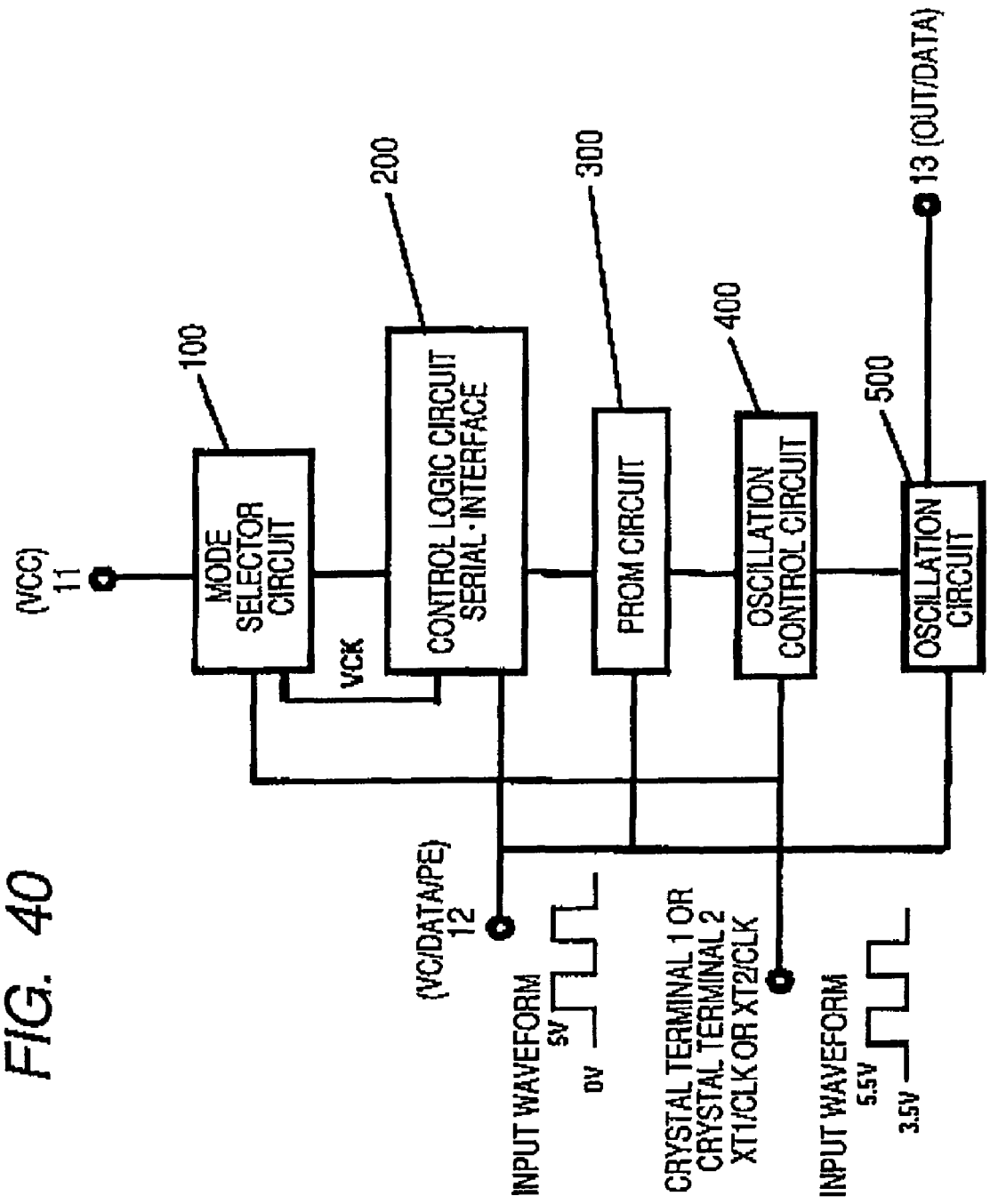
FIG. 40 is a block diagram (11) of an IC for TCXO according to the sixth embodiment of the present invention.

FIGS. 39 and 40 show block diagrams of a TCXO control IC according to a seventh embodiment of the present invention. CLK is inputted from crystal terminal 1 or crystal terminal 2 (XT1 or XT2) and DATA is inputted from the input terminal (VC) 12 to set the emulation mode (EM).

In this manner, it is possible to input CLK from one of the crystal terminals. A signal is inputted from one of the crystal terminals to the mode selector circuit 100. Upon inputting the mode select signal, VCC2 is raised to switch the TCXO to the emulation mode or the write mode.

A basic operation is similar to when CLK is inputted from the VCC terminal 11 and DATA is inputted from the input terminal 12.

Figure 41:
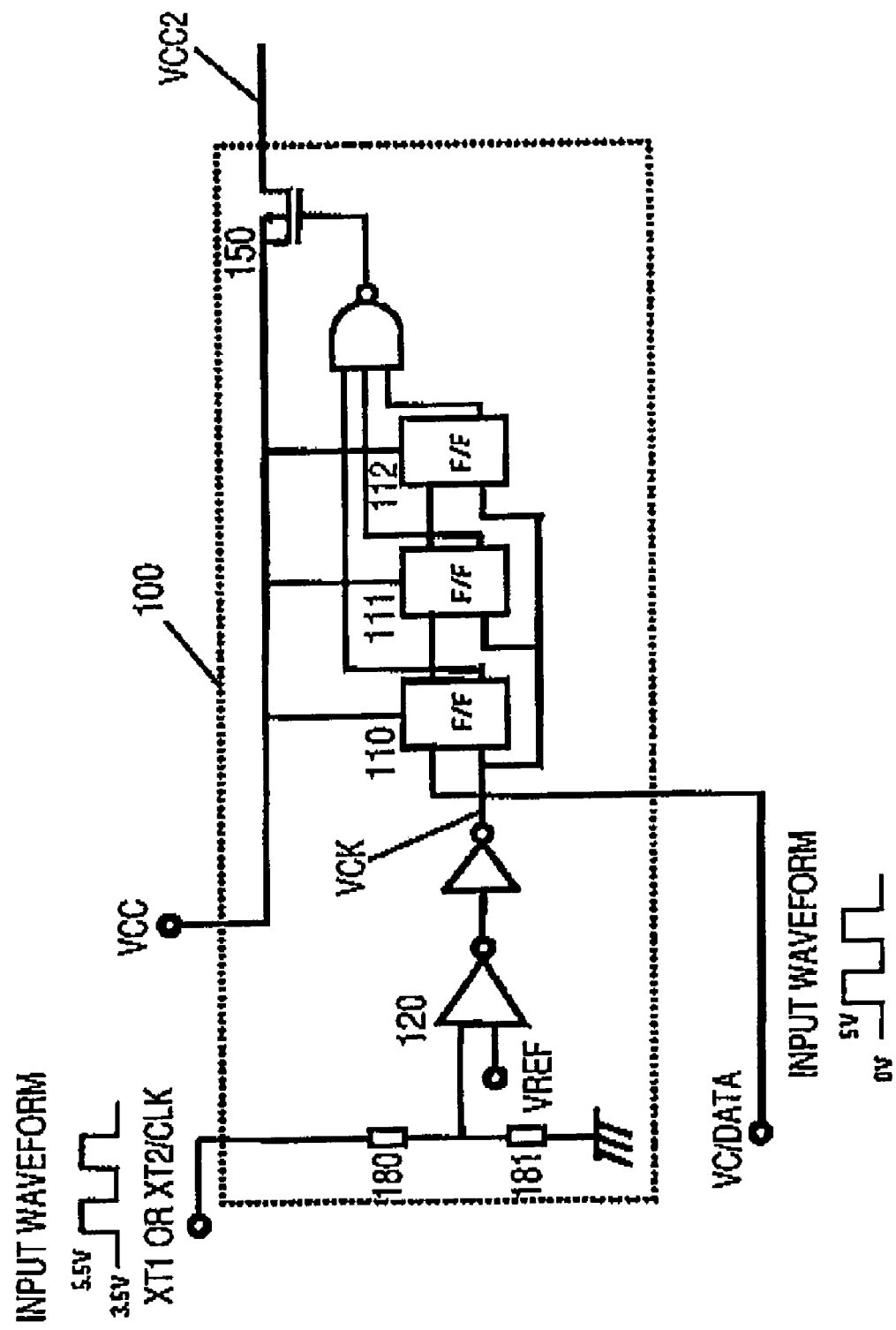
FIG. 41 is a block diagram of a mode selector circuit according to the sixth embodiment of the present invention.

FIG. 41 is a block diagram of the mode selector circuit 100 according to this embodiment. The mode selector circuit 100 has a comparator 120 with an internal reference voltage VREF of the IC as a reference, and a CLK signal of, for example, 3.6 V to 5.5 V is inputted to the comparator 120 from the power terminal (crystal terminal 1 or 2/CLK). The input of the comparator 120 is adjusted by dividing the voltage of the CLK signal by means of a resistor 180 and a resistor 181.

That is, the comparator 120 outputs, as a pulse signal, a result of comparison between a voltage of a signal inputted from the crystal terminal (XT1 or XT2/CLK) (a CLK signal voltage divided by means of the resistor 180 and the resistor 181) and the internal reference voltage VREF of the IC.

Accordingly, a signal of 0 V to VCC can be obtained as an input VCK of the F/F circuit 110.

Figure 42:
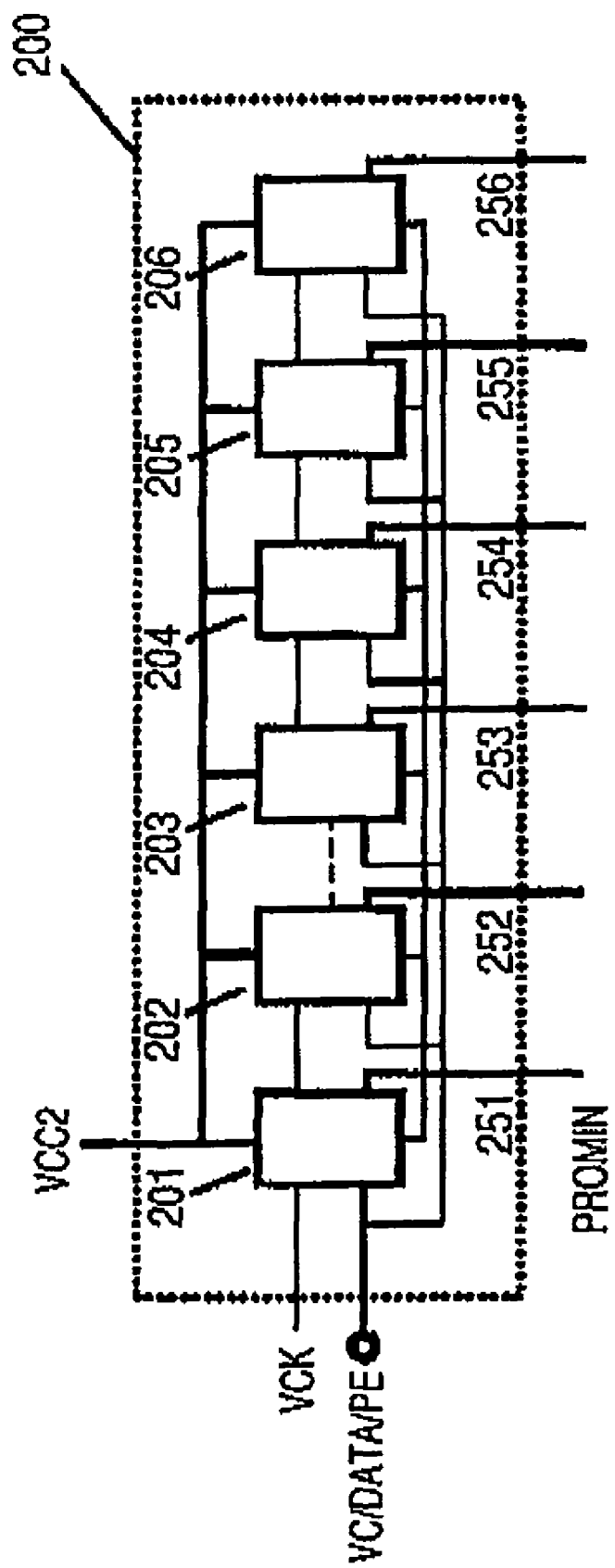
FIG. 42 is a block diagram of a control logic unit according to the sixth embodiment of the present invention.

FIG. 42 is a block diagram of the control logic circuit serial•interface 200 according to this embodiment. When the power voltage. VCC2 is raised in the mode selector circuit 100, power is supplied to the control logic circuit serial•interface 200, thereby making the emulation mode (EM) operable. A signal VCK is inputted to an input clock of the control logic circuit serial•interface 200 and DATA is inputted from the input terminal (VC/DATA). The inputted DATA include a plurality of PROM bit data to be delivered to the PROM circuit 300.

Figure 43:
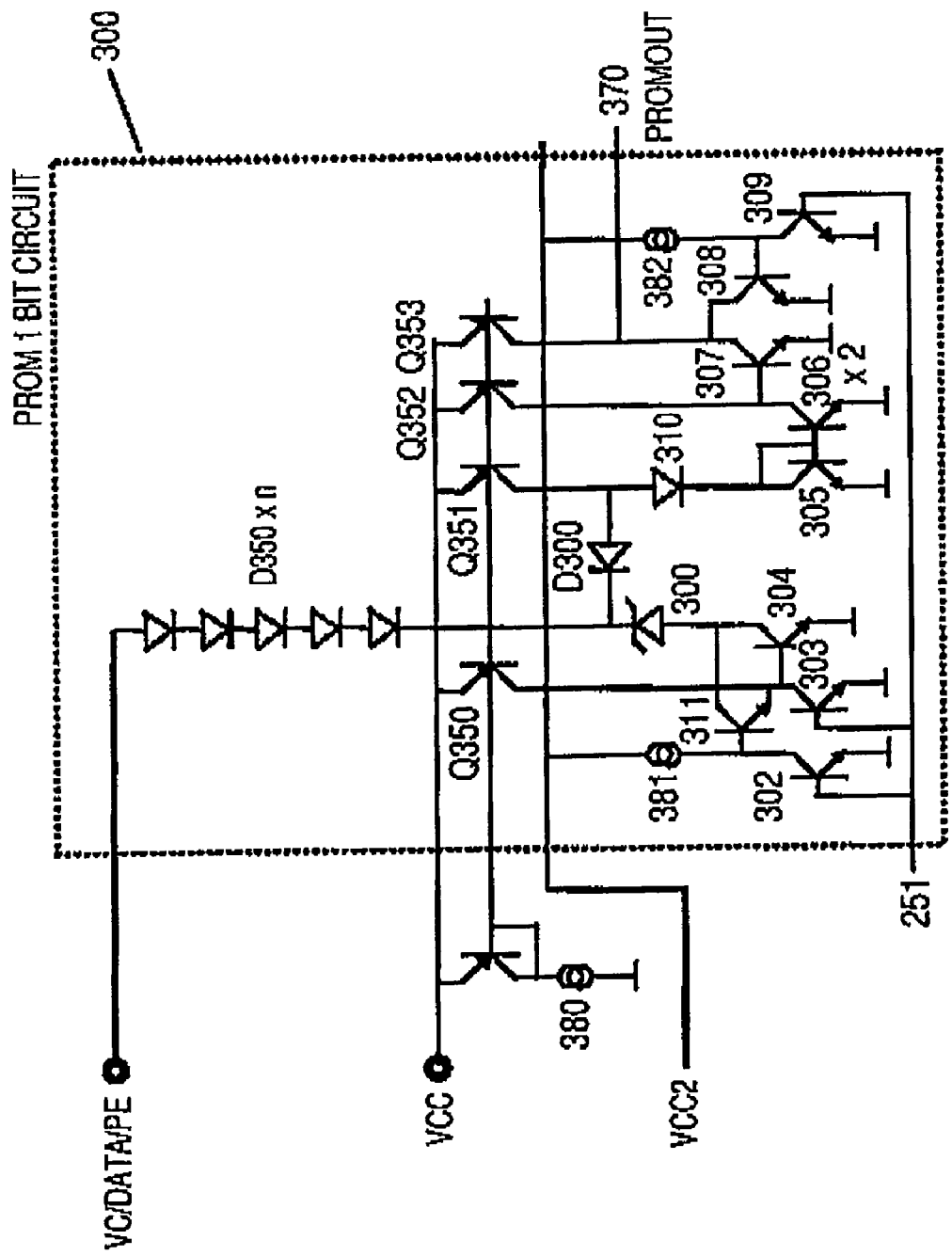
FIG. 43 is a block diagram of a PROM circuit according to the sixth embodiment of the present invention.

FIG. 43 is a block diagram of the PROM (1 bit) circuit 300 according to this embodiment.

An output 251 from an F/F circuit 201 of the control logic circuit serial•interface 200 is inputted to the PROM circuit 300. PROMOUT is switched by a signal from the F/F circuit 201 and a signal is inputted to the oscillation control circuit 400 to control a frequency. Here, an adjusted desired frequency is written in the PROM circuit 300 from the input terminal (VC/PE) 12.

FIG. 44 is a view for explaining a mode (emulation mode to read mode) switching setting method according to this embodiment, FIG. 44A showing an input waveform of the crystal terminal (X1 or XT2/CLK) 11, FIG. 44B showing a voltage waveform of the power voltage VCC2 supplied from the mode selector circuit 100, FIG. 44C showing an input waveform of the input terminal (VC/DATA) (in case of FIG. 39), and FIG. 44D showing an input waveform of the output terminal (OUT/DATA) 13 (in case of FIG. 40).

The crystal terminals 1 and 2 outputs a waveform close to SIN of 0 V to 2 V (signal having a waveform with a voltage peak clipped) in a normal read mode. In this embodiment, attention has to be given when CLK is inputted from the crystal terminal 1 or 2.

The crystal terminals 1 and 2 typically have a high impedance, so it has not conventionally been recommended that a voltage be applied to the crystal terminals 1 and 2 from the outside.

However, in this embodiment, a voltage of 3.5 V to 5.5 V, which is out of a normal range of operation, is inputted to the crystal terminals to set a mode.

Thereafter, it is possible to measure a frequency in the emulation mode except for the crystal terminal 1 or 2.

In the above description, switching between read mode/emulation mode/write mode has been described with an example of ONE-time PROM. However, the above embodiments may be used to use terminals in common for the read mode/write mode without no emulation mode with an ANY-time PROM (multi-writable PROM).

In the above description, switching between read mode/emulation mode/write mode has been described with an example of ONE-time PROM. However, the above embodiments may be used to use terminals in common for the read mode/write mode without no emulation mode with an ANY-time PROM (multi-writable PROM). Hereinafter, flows in adjustment of TCXO using a ONE-time PROM and an ANY-time PROM will be described.

Figure 37:
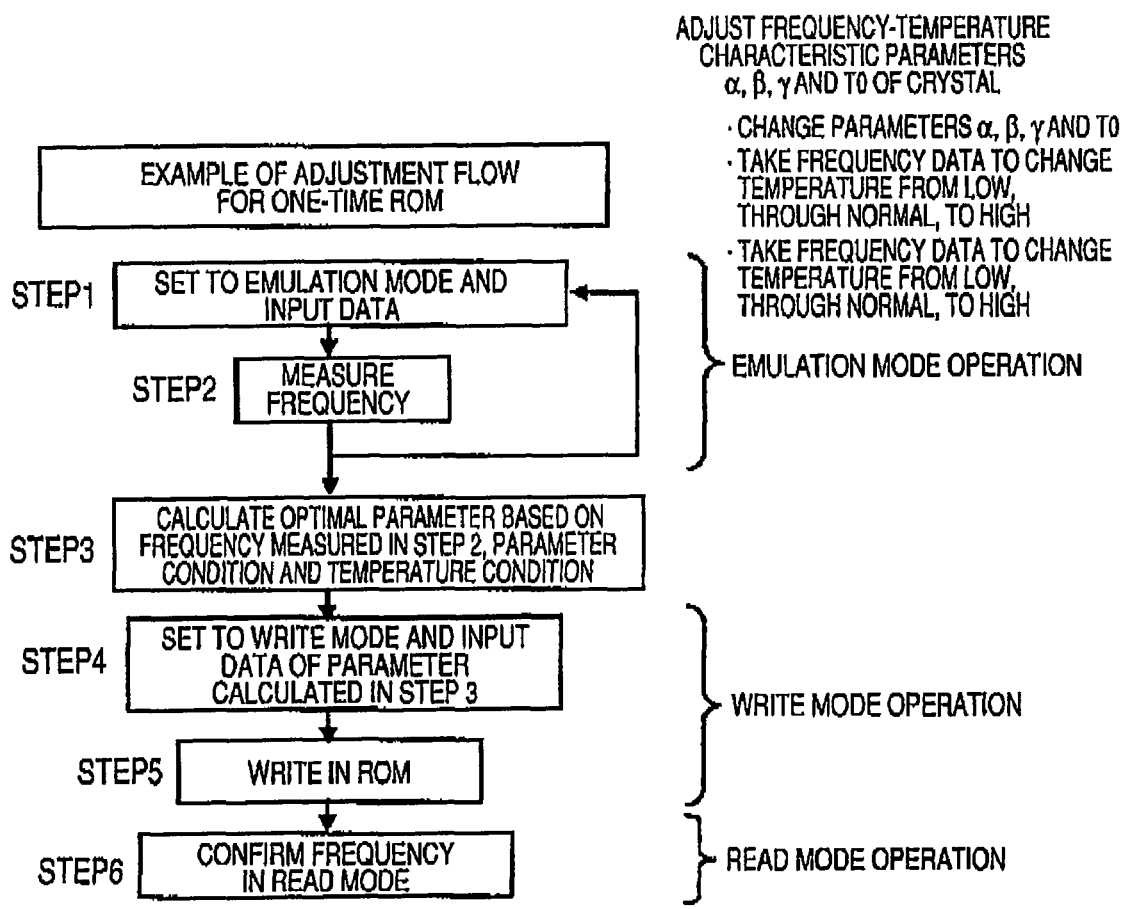
FIG. 37 is a view showing an exemplary adjustment flow for a ONE-time ROM.

FIG. 37 is a flow chart showing TCXO adjustment using a ONE-time PROM.

A ONE-time PROM has a just once-write opportunity. Accordingly, only data are inputted in an emulation mode in Step 1 and a frequency is measured in Step 2. This process is repeated to acquire frequency data for different parameters and different temperatures.

The frequency data acquired in Step 2 are analyzed in Step 3 to calculate a ROM setting having the highest frequency stability.

The optimal parameter calculated in Step 3 is set to a write mode in Step 4 and is then written in the PROM in Step 5.

Finally, it is confirmed in Step 6 that a frequency is temperature-compensated in the read mode.

Figure 38:
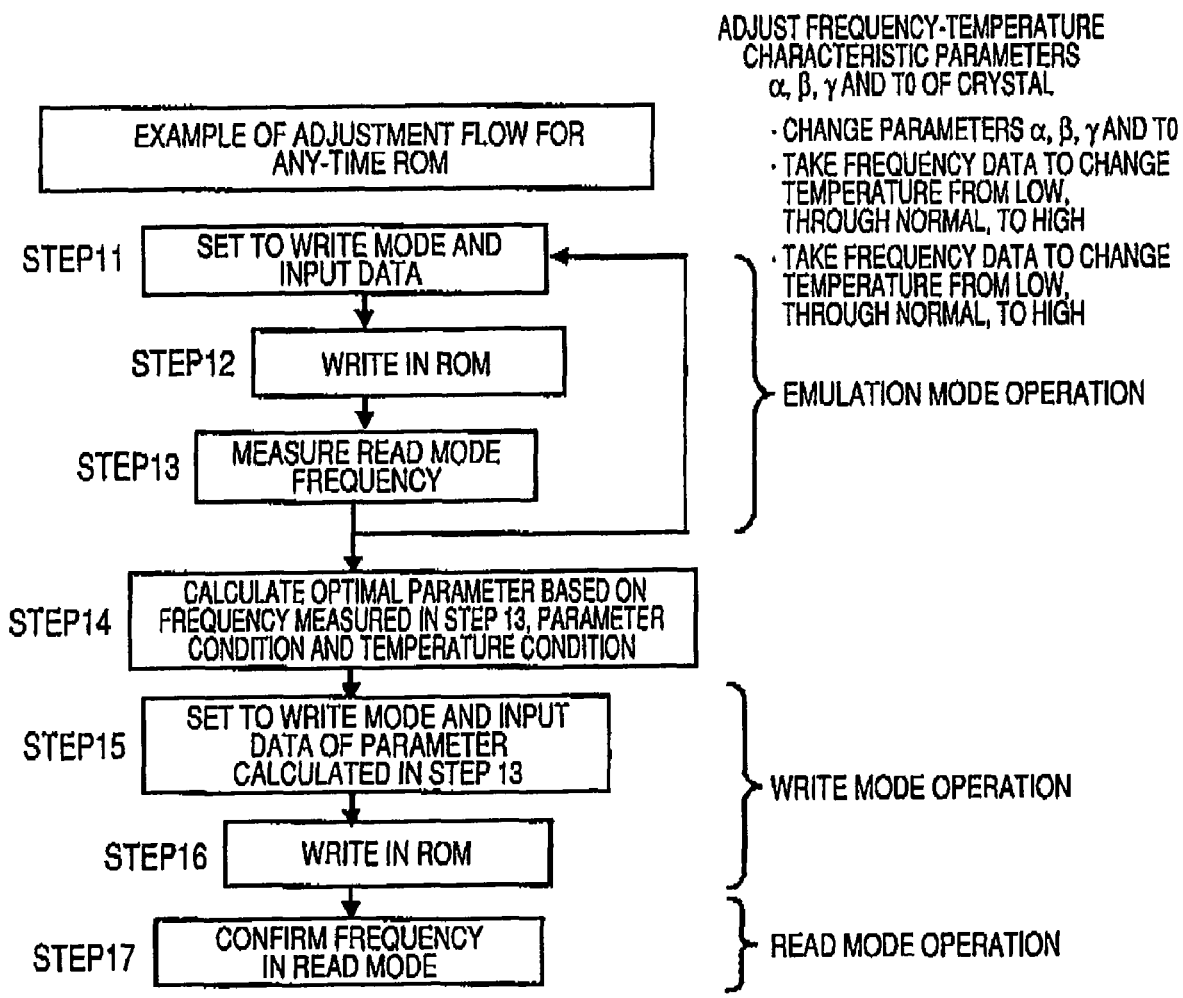
FIG. 38 is a view showing an exemplary adjustment flow for an ANY-time ROM.

FIG. 38 is a flow chart showing TCXO adjustment using an ANY-time PROM.

In case of an ANY-time PROM, it is possible to write data and acquire frequency data on every occasion with no emulation mode circuit.

The ANY-time PROM requires a very small chip size. Accordingly, it is required to write frequency data in a ROM every time the frequency data are acquired, instead of reducing the chip size with no emulation mode circuit. This may need a longer write time to acquire the frequency data.

In Step 11, data are inputted in the write mode. Thereafter, the data are written in Step 12 and a frequency is measured in Step 13. This process is repeated to acquire frequency data for different parameters and different temperatures. The above steps are the same as in the emulation mode in adjustment of TCXO using the ONE-time PROM, which will be described.

The frequency data acquired in Step 13 are analyzed in Step 14 to calculate a ROM setting having the highest frequency stability.

The optimal parameter calculated in Step 14 is set to a write mode in Step 15 and is then written in the PROM in Step 16. Finally, it is confirmed in Step 17 that a frequency is temperature-compensated in the read mode.

The processes in Steps 13 to 17 are the same irrespective of PROM.

The processes of Stops 11 to 13 shown in FIG. 38 have the same purpose as Steps 1 and 2 shown in FIG. 37. That is, it can be said that these processes are for determining data to be finally written and result in the emulation mode.

As described above, there is no change of configuration of terminal common use and its basic operation depending on the kind of the PROM.

While the method for common use of the CLK function and the DATA function in different terminals has been suggested in the above description, for example, the same effects can be obtained even if terminals using the CLK function and the DATA function in common are reversed.

While the method for common use of the CLK function and the DATA function in different terminals has been suggested in the above embodiments, for example, the same effects can be obtained even if terminals using the CLK function and the DATA function in common are reversed.

The purport of need of EM/WM/RM and their corresponding operation for temperature compensation have been illustrated in the above embodiments. However, without being limited to the temperature compensation, there may be a need of PROM for frequency adjustment of a crystal oscillator or change of a function of an input terminal.

Accordingly, terminal common use of the present invention is effective. The reason why the present invention is effective in the function change of the input terminal is as follows.

The present invention is directed to the technique for common use of terminal functions under constraints of 6 terminals. Here, 6 terminals include the power terminal, the ground terminal, the output terminal, the input terminal, the crystal terminal 1 and the crystal terminal 2.

In recent years, the input terminal has been value-added with various functions. For example, the input terminal may further have various functions including a sweep mode switching input terminal, a standby mode switching input terminal, a temperature sensor output terminal, etc. It is possible to achieve such switching of functions by inputting DATA and CLK with common use of terminals and easily writing DATA and CLK in a PROM with the less number of terminals as in the present invention.

The present invention has the effect of terminal common use without requiring switching of circuit connection for frequency adjustment, which is useful in TCXO and so on.

What is claimed is:

1. An IC for control of a temperature-compensated crystal oscillator, comprising:
   a power terminal, through which a power voltage and a dock signal are supplied;
   an input terminal, through which a predetermined control signal is supplied;
   a PROM circuit in which adjustment data to cancel a temperature characteristic of the crystal oscillator are written, the crystal oscillator having a read mode for reading data written in the PROM circuit and controlling a frequency of the crystal oscillator,
   an emulation mode for determining data to be written in the PROM circuit, and a write mode for writing the data determined in the emulation mode in the PROM circuit,
   a first mode selector circuit for switching the crystal oscillator to the emulation mode or the write mode when a first signal in which the power voltage and the clock signal supplied through the power terminal are superimposed, is inputted from the power terminal and a second signal having a predetermined pattern is inputted from the input terminal, wherein
   the first mode selector circuit includes:
      a comparator that outputs, as a pulse signal, a result of comparison between the first signal and a predetermined reference voltage;
      a first flip-flop circuit of predetermined stages, that shifts the second signal based on the pulse signal outputted from the comparator; and
      a transistor that controls the power voltage based on an output signal of the first flip-flop circuit.

2. The IC for control of a temperature-compensated crystal oscillator according to claim 1, wherein a level of the first signal has a voltage higher than a voltage in a normal operation.

3. The IC for control of a temperature-compensated crystal oscillator according to claim 1, further comprising:
   a logic circuit that controls the transistor when outputs of the stages of the first flip-flop circuit match the predetermined pattern.

4. The IC for control of a temperature-compensated crystal oscillator according to claim 1, further comprising:
   a control logic circuit that set data to be written in the PROM circuit in the emulation mode or the write mode, the control logic circuit being operated when the power voltage is controlled by the first mode selector circuit or a signal.

5. The IC for control of a temperature-compensated crystal oscillator according to claim 4, wherein the control logic circuit includes predetermined stages of second flip-flop circuit that shifts the second signal based on the dock signal.

6. The IC for control of a temperature-compensated crystal oscillator according to claim 1, further comprising
   six terminals including a first terminal through which the first signal is supplied, and a second terminal through which the second signal is supplied.

7. An IC for control of a temperature-compensated crystal oscillator, comprising:
   a power terminal, through which a power voltage and a dock signal are supplied;
   an input terminal, through which a predetermined control signal is supplied;
   a PROM circuit in which adjustment data to cancel a temperature characteristic of the crystal oscillator are written, the crystal oscillator having a read mode for reading data written in the PROM circuit and controlling a frequency of the crystal oscillator,
   an emulation mode for determining data to be written in the PROM circuit, and a write mode for writing the data determined in the emulation mode in the PROM circuit,
   a first mode selector circuit for switching the crystal oscillator to the emulation mode or the write mode when a first signal in which the power voltage and the clock signal supplied through the power terminal are superimposed, is inputted from the power terminal and a second signal having a predetermined pattern is inputted from the input terminal, wherein
   the PROM circuit includes a plurality of serial-connected diodes that are connected in series to the input terminal and limit an amplitude of a write data signal.

* * * * *